United States Patent
Matsuda et al.

(10) Patent No.: US 10,424,722 B2
(45) Date of Patent: Sep. 24, 2019

(54) PIEZOELECTRIC ELEMENT, PIEZOELECTRIC ACTUATOR, AND ELECTRONIC APPARATUS

(71) Applicant: CANON KABUSHIKI KAISHA, Tokyo (JP)

(72) Inventors: Takanori Matsuda, Chofu (JP); Makoto Kubota, Yokohama (JP); Kaoru Miura, Matsudo (JP)

(73) Assignee: CANON KABUSHIKI KAISHA, Tokyo (JP)

(*) Notice: Subject to any disclaimer, the term of this patent is extended or adjusted under 35 U.S.C. 154(b) by 89 days.

(21) Appl. No.: 15/354,277

(22) Filed: Nov. 17, 2016

(65) Prior Publication Data

US 2017/0155035 A1     Jun. 1, 2017

(30) Foreign Application Priority Data

Nov. 27, 2015 (JP) ................. 2015-231465

(51) Int. Cl.
*H01L 41/187* (2006.01)
*B06B 1/06* (2006.01)
(Continued)

(52) U.S. Cl.
CPC ........... *H01L 41/1871* (2013.01); *B06B 1/06* (2013.01); *B41J 2/14201* (2013.01);
(Continued)

(58) Field of Classification Search
CPC ............ H01L 41/1871; H01L 41/0805; H01L 41/0815; H04R 17/005; H04R 17/00;
(Continued)

(56) References Cited

U.S. PATENT DOCUMENTS

| 6,744,204 B2 * | 6/2004 | Groen ............... H01J 61/06 313/231.11 |
| 7,033,521 B2 | 4/2006 | Iwashita et al. |

(Continued)

FOREIGN PATENT DOCUMENTS

JP    2011-243722 A    12/2011

OTHER PUBLICATIONS

Matsuda et al., U.S. Appl. No. 15/354,297, filed Nov. 17, 2016.
(Continued)

*Primary Examiner* — Jason A Flohre
(74) *Attorney, Agent, or Firm* — Venable LLP

(57) ABSTRACT

Provided is a piezoelectric element containing no lead therein and having a satisfactory piezoelectric constant and a small dielectric loss tangent at room temperature (25° C.) In order to attain this, the piezoelectric element includes a substrate, a first electrode, a piezoelectric film, and a second electrode. The piezoelectric film contains barium zirconate titanate, manganese, and trivalent bismuth. The piezoelectric film satisfies $0.02 \leq x \leq 0.13$, where x is a mole ratio of zirconium to the sum of zirconium and titanium. A manganese content is 0.002 moles or more and 0.015 moles or less for 1 mole of barium zirconate titanate, and a bismuth content is 0.00042 moles or more and 0.00850 moles or less for 1 mole of barium zirconate titanate.

35 Claims, 10 Drawing Sheets

(51) Int. Cl.

| | | |
|---|---|---|
| *B41J 2/14* | (2006.01) | |
| *G01C 19/5776* | (2012.01) | |
| *G01S 7/521* | (2006.01) | |
| *G01S 15/02* | (2006.01) | |
| *G02B 26/02* | (2006.01) | |
| *G02B 26/08* | (2006.01) | |
| *G02B 27/64* | (2006.01) | |
| *H01L 41/08* | (2006.01) | |
| *H02N 2/18* | (2006.01) | |
| *H03H 9/64* | (2006.01) | |
| *H04N 5/232* | (2006.01) | |
| *H04R 17/00* | (2006.01) | |
| *G01S 15/89* | (2006.01) | |
| *H04R 17/02* | (2006.01) | |
| *H04R 31/00* | (2006.01) | |

(52) U.S. Cl.
CPC ...... *B41J 2/14233* (2013.01); *G01C 19/5776* (2013.01); *G01S 7/521* (2013.01); *G01S 15/02* (2013.01); *G02B 26/02* (2013.01); *G02B 26/0858* (2013.01); *G02B 27/646* (2013.01); *H01L 41/0805* (2013.01); *H01L 41/0815* (2013.01); *H02N 2/186* (2013.01); *H03H 9/64* (2013.01); *H04N 5/2328* (2013.01); *H04R 17/00* (2013.01); *H04R 17/005* (2013.01); *B41J 2202/03* (2013.01); *G01S 15/8911* (2013.01); *G01S 15/8915* (2013.01); *H04R 17/025* (2013.01); *H04R 31/00* (2013.01)

(58) Field of Classification Search
CPC .... H04R 17/025; H04R 31/00; B41J 2/14233; B41J 2/14201; B41J 2202/03; G01S 15/02; G01S 7/521; G01S 15/8911; G01S 15/8915; G02B 26/02; G02B 26/0858; G02B 27/646; H04N 5/2328; H02N 2/186; H03H 9/64; B06B 1/06; G01C 19/5776
See application file for complete search history.

(56) References Cited

U.S. PATENT DOCUMENTS

| | | | |
|---|---|---|---|
| 8,529,785 B2 | 9/2013 | Kubota et al. | |
| 8,547,001 B2 | 10/2013 | Saito et al. | |
| 8,980,117 B2 | 3/2015 | Kubota et al. | |
| 9,022,531 B2 | 5/2015 | Kubota et al. | |
| 9,022,534 B2 | 5/2015 | Yabuta et al. | |
| 9,082,975 B2 | 7/2015 | Kubota et al. | |
| 9,082,976 B2 | 7/2015 | Kubota et al. | |
| 9,231,188 B2 | 1/2016 | Suzuki et al. | |
| 9,252,685 B2 | 2/2016 | Ifuku et al. | |
| 9,306,149 B2 | 4/2016 | Hayashi et al. | |
| 9,712,748 B2* | 7/2017 | Kawai | H04N 5/23287 |
| 9,893,268 B2* | 2/2018 | Matsuda | H01L 41/18 |
| 9,981,292 B2* | 5/2018 | Matsuda | B08B 7/02 |
| 2011/0012050 A1* | 1/2011 | Hayashi | C01G 23/003 |
| | | | 252/62.9 PZ |
| 2014/0145106 A1* | 5/2014 | Hayashi | C04B 35/4682 |
| | | | 252/62.9 PZ |
| 2016/0104833 A1 | 4/2016 | Suzuki et al. | |
| 2016/0204336 A1 | 7/2016 | Shimizu et al. | |
| 2016/0225976 A1* | 8/2016 | Yokoyama | H01L 41/1873 |
| 2016/0284972 A1* | 9/2016 | Kojima | H01L 41/098 |
| 2017/0155034 A1 | 6/2017 | Matsuda et al. | |
| 2017/0155036 A1 | 6/2017 | Kubota et al. | |
| 2017/0155037 A1 | 6/2017 | Kubota et al. | |
| 2017/0256700 A1* | 9/2017 | Murakami | H01L 41/316 |

OTHER PUBLICATIONS

Kubota et al., U.S. Appl. No. 15/354,319, filed Nov. 17, 2016.
Kubota et al., U.S. Appl. No. 15/354,349, filed Nov. 17, 2016.
Non-final Office Action in U.S. Appl. No. 15/354,297 (dated Jul. 6, 2017).
Saburo Nagakura et al. (ed.), Iwanami Physicochemical Dictionary, Fifth Edition, pp. 1-3 (Iwanami Shoten, Publishers; Feb. 1998) (English language translation).
Non-final Office Action in U.S. Appl. No. 15/625,209 (dated Jun. 7, 2019).

\* cited by examiner

PIEZOELECTRIC ELEMENT, PIEZOELECTRIC ACTUATOR, AND ELECTRONIC APPARATUS

BACKGROUND OF THE INVENTION

Field of the Invention

The present invention relates to a thin film piezoelectric element substantially containing no lead therein. The present invention also relates to a piezoelectric actuator, a liquid ejection head, a liquid ejection apparatus, a shake correction mechanism, a variable shape optical element, a movable optical member, an optical device, an image pickup apparatus, an optical switch, a micromirror device, an ultrasonic wave probe, an ultrasonograph, a sound component, an angular velocity sensor, a vibration power generator, a surface acoustic wave generator, a piezoelectric shutter, and an electronic apparatus using the piezoelectric element.

Description of the Related Art

A thin film piezoelectric element typically includes a lower electrode, an upper electrode, and a piezoelectric film sandwiched therebetween. The piezoelectric film is formed of a polycrystal of a ferroelectric metal oxide. A typical principal component of the piezoelectric film is an $ABO_3$ type perovskite metal oxide, e.g., lead zirconate titanate (hereinafter referred to as "PZT"). However, PZT contains lead as an A-site element, and thus, influence thereof on the environment is perceived as a problem. Therefore, a piezoelectric film containing no lead therein (lead-free piezoelectric film) is required.

As a lead-free piezoelectric film, a barium zirconate titanate film is known. In Japanese Patent Application Laid-Open No. 2011-243722, it is disclosed that, through adding of a manganese oxide of 2 mol % or more and 4 mol % or less to a sum of titanium and zirconium of barium zirconate titanate, a crack in the piezoelectric film is suppressed. However, the disclosed composition has a large dielectric loss, and thus, has a problem in power consumption and heat generation when a piezoelectric element is driven. There is also a problem in that a piezoelectric constant of the lead-free piezoelectric film is insufficient for practical use.

The present invention has been made to solve the problems described above, and provides a thin film piezoelectric element containing no lead therein, which has a high Curie temperature at a piezoelectric film portion thereof, a small dielectric loss, and a high piezoelectric constant at room temperature.

The present invention also provides a piezoelectric actuator, a liquid ejection head, a liquid ejection apparatus, a shake correction mechanism, a variable shape optical element, a movable optical member, an optical device, an image pickup apparatus, an optical switch, a micromirror device, an ultrasonic wave probe, an ultrasonograph, a sound component, an angular velocity sensor, a vibration power generator, a surface acoustic wave generator, a piezoelectric shutter, and an electronic apparatus using the piezoelectric element.

SUMMARY OF THE INVENTION

According to one embodiment of the present invention, there is provided a piezoelectric element of a first mode, including:
a substrate;
a first electrode;
a piezoelectric film; and
a second electrode,
in which the piezoelectric film contains barium zirconate titanate, manganese, and trivalent bismuth,
in which the piezoelectric film satisfies $0.02 \leq x \leq 0.13$, where x is a mole ratio of zirconium to a sum of zirconium and titanium,
in which a manganese content is 0.002 moles or more and 0.015 moles or less for 1 mole of barium zirconate titanate, and
in which a bismuth content is 0.00042 moles or more and 0.00850 moles or less for 1 mole of barium zirconate titanate.

According to one embodiment of the present invention, there is provided a piezoelectric actuator, including: the piezoelectric element of the first mode described above; and a diaphragm on which the piezoelectric element is formed.

According to one embodiment of the present invention, there is provided a liquid ejection head, including: a liquid chamber including a vibration unit including the piezoelectric element of the first mode described above; and an ejection orifice communicating with the liquid chamber.

According to one embodiment of the present invention, there is provided a liquid ejection apparatus, including: a placing unit for a transfer target; and the above-mentioned liquid ejection head.

According to one embodiment of the present invention, there is provided a shake correction mechanism, including: two or more above-mentioned piezoelectric actuators, in which the two or more piezoelectric actuators are arranged such that, when a voltage is applied thereto, the two or more piezoelectric actuators expand and contract in two or more directions.

According to one embodiment of the present invention, there is provided a variable shape optical element, including: the above-mentioned piezoelectric actuator; an optical member dynamically connected to the piezoelectric actuator; and a mechanism for changing a shape of the optical member through deformation of the piezoelectric actuator.

According to one embodiment of the present invention, there is provided a movable optical member, including: the above-mentioned piezoelectric actuator; an optical member dynamically connected to the piezoelectric actuator; and a mechanism for moving and/or rotating the optical member through deformation of the piezoelectric actuator.

According to one embodiment of the present invention, there is provided an optical device, including: the above-mentioned shake correction mechanism and an optical member held by the shake correction mechanism; or the above-mentioned variable shape optical element or the above-mentioned movable optical member.

According to one embodiment of the present invention, there is provided an image pickup apparatus, including: the above-mentioned shake correction mechanism; and an image pickup element unit held by the shake correction mechanism.

According to one embodiment of the present invention, there is provided an optical switch, including the above-mentioned variable shape optical element or the above-mentioned movable optical member.

According to one embodiment of the present invention, there is provided a micromirror device, including at least: a plurality of micromirrors; and a plurality of the above-mentioned piezoelectric actuators dynamically connected to the plurality of micromirrors, respectively.

According to one embodiment of the present invention, there is provided an ultrasonic wave probe, including the above-mentioned piezoelectric actuator, the ultrasonic wave probe having a function of oscillating an ultrasonic wave and a function of receiving a reflected wave.

According to one embodiment of the present invention, there is provided an ultrasonograph, including: the above-mentioned ultrasonic wave probe; a signal processing unit; and an image generating unit.

According to one embodiment of the present invention, there is provided a sound component, including the above-mentioned piezoelectric actuator and being configured to perform one of sending and receiving sound through driving of the piezoelectric actuator.

According to one embodiment of the present invention, there is provided an angular velocity sensor, including the above-mentioned piezoelectric element and being configured to convert change in shape of the piezoelectric element into angular velocity information.

According to one embodiment of the present invention, there is provided a vibration power generator, including the above-mentioned piezoelectric element and being configured to convert vibrational energy into electric energy.

According to one embodiment of the present invention, there is provided a piezoelectric element of a second mode, including:
 a substrate;
 a piezoelectric film; and
 a plurality of comb electrodes,
 in which the piezoelectric film contains barium zirconate titanate, manganese, and trivalent bismuth, in which the piezoelectric film satisfies $0.02 \leq x \leq 0.13$, where x is a mole ratio of zirconium to a sum of zirconium and titanium,
 in which a manganese content is 0.002 moles or more and 0.015 moles or less for 1 mole of barium zirconate titanate, and
 in which a bismuth content is 0.00042 moles or more and 0.00850 moles or less for 1 mole of barium zirconate titanate.

According to one embodiment of the present invention, there is provided an electronic apparatus, including: an electronic component; and the above-mentioned piezoelectric element, the piezoelectric element being formed in relation to an electronic component.

According to one embodiment of the present invention, there is provided a surface acoustic wave generator, including the piezoelectric element of the second mode described above.

According to one embodiment of the present invention, there is provided a piezoelectric shutter, including at least the above-mentioned surface acoustic wave generator and a light-shielding component, the piezoelectric shutter having a function of moving the light-shielding component through driving of the surface acoustic wave generator.

According to one embodiment of the present invention, there is provided an electronic apparatus, including an electronic component and the piezoelectric element formed in relation to the electronic component.

DESCRIPTION OF THE EMBODIMENTS

Preferred embodiments of the present invention will now be described in detail in accordance with the accompanying drawings.

A piezoelectric element according to a first mode of the present invention includes a substrate, a first electrode, a piezoelectric film, and a second electrode. The piezoelectric film contains barium zirconate titanate, manganese, and trivalent bismuth.

The piezoelectric film satisfies $0.02 \leq x \leq 0.13$, where x is a mole ratio of zirconium to a sum of zirconium and titanium.

A manganese content is 0.002 moles or more and 0.015 moles or less for 1 mole of barium zirconate titanate, and a bismuth content is 0.00042 moles or more and 0.00850 moles or less for 1 mole of barium zirconate titanate.

It is more preferred that the piezoelectric film contain a principle component including a perovskite metal oxide expressed by the following general formula (1):

$$Ba(Ti_{1-x}Zr_x)O_3 \qquad (1),$$

provided that $0.02 \leq x \leq 0.13$.

(Configuration of Piezoelectric Element)

Figure 1A:
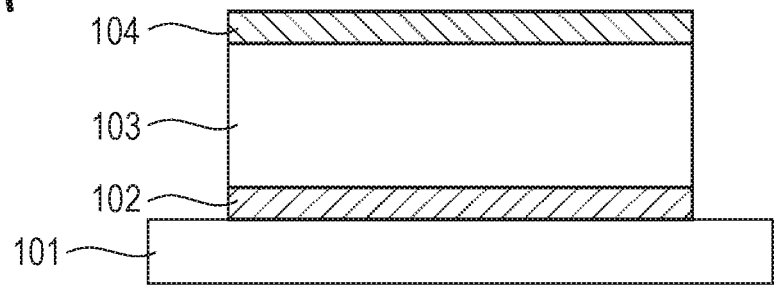
FIG. 1A, FIG. 1B, and FIG. 1C are schematic sectional views for illustrating exemplary configurations of a piezoelectric element according to a first mode of the present invention.
Figure 1B:
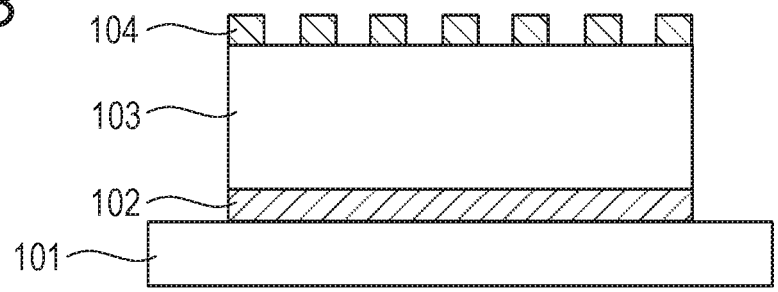
Figure 1C:
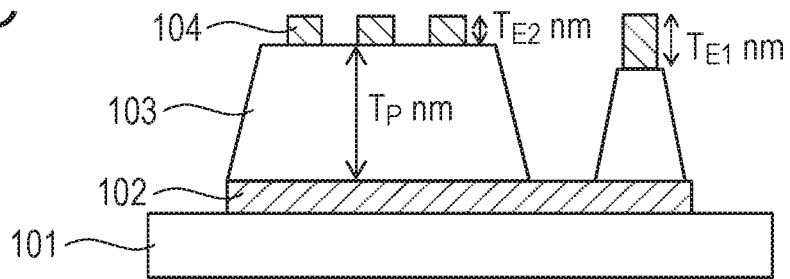
Figure 2A:
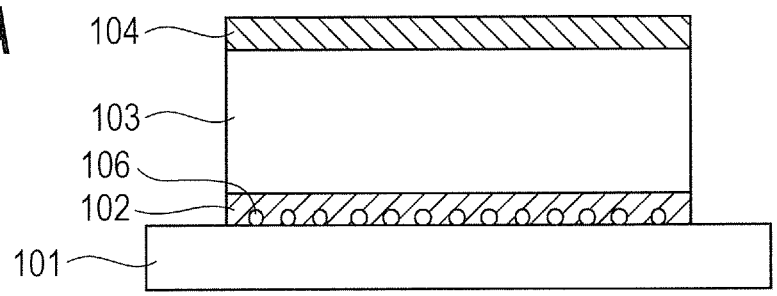
FIG. 2A, FIG. 2B, and FIG. 2C are schematic sectional views for illustrating other exemplary configurations of the piezoelectric element according to the first mode of the present invention.
Figure 2B:
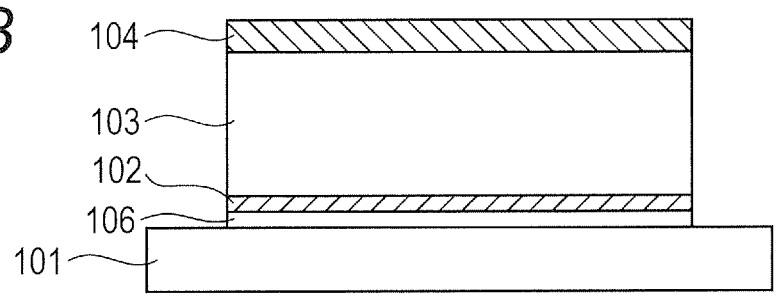
Figure 2C:
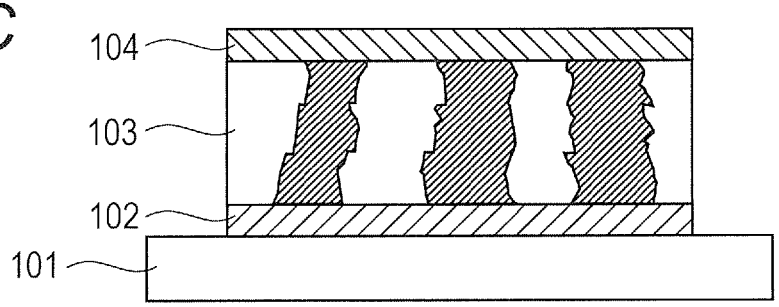

FIG. 1A to FIG. 1C are schematic sectional views for illustrating exemplary configurations of the first mode of the piezoelectric element according to the present invention. The first mode of the piezoelectric element according to the present invention has a configuration including a substrate 101, a first electrode 102, a piezoelectric film 103, and a second electrode 104. FIG. 1A is an illustration of an embodiment in which the first electrode 102, the piezoelectric film 103, and the second electrode 104 have the same area and end portions thereof are aligned in a direction perpendicular to the substrate 101, but the mode of the piezoelectric element of the present invention is not limited that illustrated in FIG. 1A. As illustrated in FIG. 1B and FIG. 1C, areas and shapes of the members can be freely changed depending on a use of the piezoelectric element. Further, insofar as the function of the piezoelectric element is not impaired, other members may be formed between the members. For example, an adhering component for enhancing adherence between the members as illustrated in FIG. 2A and FIG. 2B, or a buffer component for enhancing crystallinity or orientation as illustrated in FIG. 2C may be formed.

Figure 15A:
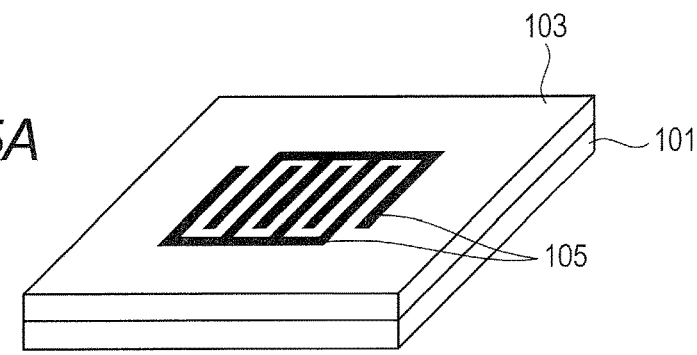
FIG. 15A is a schematic perspective view for illustrating an exemplary configuration of a piezoelectric element according to a second mode of the present invention.

FIG. 15A is a schematic perspective view for illustrating an exemplary configuration of a piezoelectric element according to a second mode of the present invention. The second mode of the piezoelectric element according to the present invention has a configuration including a substrate 101, a piezoelectric film 103, and a plurality of comb electrodes 105. The number of the comb electrodes 105 is two or more and is not limited to the ones illustrated in FIG. 15A, but it is preferred that two comb electrodes be in a pair and comb portions thereof be engaged with each other. It is preferred that the number of the comb electrodes 105 be a multiple of two. The substrate 101 and the piezoelectric film 103 may be patterned.

(Substrate)

A material of the substrate 101 is not limited, but a material that does not deform and melt in a heating step when the first electrode 102, the piezoelectric film 103, and the second electrode 104 are formed is preferred. A maximum temperature in the heating step is typically 800° C. or lower. For example, it is preferred to use a monocrystalline substrate of magnesium oxide (MgO), strontium titanate ($SrTiO_3$), lanthanum aluminate ($LaAlO_3$), or the like, a ceramic substrate of zirconia ($ZrO_2$), alumina ($Al_2O_3$), silica ($SiO_2$), or the like, a semiconductor substrate of silicon (Si), tungsten (W), or the like, or a heat-resistant stainless steel (SUS) substrate. A plurality of kinds of those materials may be combined, or may be laminated to be used as a multilayer configuration.

When the piezoelectric film 103 is selectively oriented in a direction perpendicular to a surface of the substrate 101, it is preferred that underlayers such as the substrate 101 and the first electrode 102 be similarly oriented. In that case, it is preferred to use a monocrystalline substrate as the substrate 101.

(Electrode)

The piezoelectric element according to the present invention includes the electrodes, and thus, a voltage can be applied to the piezoelectric film 103 to cause a piezoelectric strain or to take out an electrical signal corresponding to a strain on the piezoelectric film 103. A material of the electrodes is not particularly limited, and may be one that is ordinarily used for a piezoelectric element. For example, a metal such as Ti, Pt, Ta, Ir, Sr, In, Sn, Au, Al, Fe, Cr, Ni, Pd, Ag, Cu, or Ru and a compound thereof may be used. In particular, it is preferred to use metal electrodes of Ti, Pt, Au, or Ru.

The first electrode 102, the second electrode 104, and the comb electrodes 105 may be formed of one of those materials, or may be formed through lamination of two or more of those materials. Further, the first electrode 102 and the second electrode 104 may be formed of materials that are different from each other.

Methods of manufacturing the first electrode 102, the second electrode 104, and the comb electrodes 105 are not limited, but a high-density electrode thin film having an excellent conductivity can be obtained through use of a method selected from sputtering, vapor deposition, and chemical solution deposition (CSD). Further, the electrodes may be patterned in a desired shape.

Electrode widths and electrode pitches of the comb electrodes 105 are not particularly limited, and are selected depending on properties of an excited surface acoustic wave, but, for example, electrode widths and electrode pitches of 10 μm or more and 500 μm or less are appropriate for excitation of a surface acoustic wave.

(Piezoelectric Film)

The piezoelectric film of the present invention refers to a thin film-like crystalline aggregate exhibiting a direct piezoelectric effect or an inverse piezoelectric effect. A thin film is an aggregate structure formed so as to cover and adhere to a single side or both sides of a plate-like base (substrate). As illustrated in FIG. 1A, an electrode layer such as the first electrode 102 or an adjusting layer may be included between the substrate 101 and the piezoelectric film 103. As illustrated in FIG. 15A, the piezoelectric film 103 may directly cover the surface of the substrate 101. The thin film of the present invention refers to a film having a thickness measured in a direction perpendicular to a surface on which the film is formed, that is, a film thickness, of less than 10 μm, and having 20 or less grains stacked in the perpendicular direction. So-called piezoelectric ceramics formed through firing of a metal oxide as an independent formed body (compact) is not included in the piezoelectric film in the piezoelectric element according to the present invention.

Differently from the case of piezoelectric ceramics independent of a substrate, the piezoelectric film adheres to the substrate, and thus, is restrained by the substrate. Compressive stress or tensile stress in a film surface direction is produced in the piezoelectric film restrained by the substrate. In other words, the piezoelectric film in the piezoelectric element according to the present invention has residual stress in a direction parallel with the surface of the substrate. The residual stress suppresses change in crystal structure of the piezoelectric film when an external environment temperature changes. As a result, the piezoelectric film has a Curie temperature that is higher than that of piezoelectric ceramics having the same composition, and a practical temperature area is widened to a high temperature side.

Note that, the internal residual stress of the piezoelectric film is produced at a surface thereof adhering to the substrate, and thus, as the film thickness becomes larger, the internal residual stress becomes smaller. For example, when the piezoelectric film has a thickness of more than 10 μm, the effect of improving the Curie temperature produced by the internal residual stress cannot be expected.

Further, the piezoelectric film also has an advantage over piezoelectric ceramics in that fine patterning thereof can be carried out. When the piezoelectric film has a thickness of less than 10 µm, processing into a desired fine pattern can be easily carried out through patterning in film formation or etching after film formation.

(Perovskite Metal Oxide)

The perovskite metal oxide of the present invention refers to a metal oxide having a perovskite structure that is ideally a cubic structure as described in "Iwanami Dictionary of Physics and Chemistry", Fifth Edition (Iwanami Shoten, published on Feb. 20, 1998). The metal oxide having a perovskite structure is generally represented by a chemical formula of $ABO_3$. In the perovskite metal oxide, the elements A and B occupy specific positions in the form of ions in a unit cell, which are called A site and B site. For example, in a cubic unit cell, the element A is positioned at a vertex of the cube while the element B occupies the body-centered position of the cube. The element O occupies a face center position of the cube as an anion of oxygen.

(Main Component of Piezoelectric Film)

In the metal oxide represented by the above-mentioned general formula (1), a metal element positioned in the A site is Ba, and metal elements positioned in the B site are Ti and Zr. However, a part of Ba may be positioned in the B site. Similarly, a part of Ti and Zr may be positioned in the A site.

A mole ratio of the elements at the B site to the element O in the general formula (1) described above is 1 to 3. Even when the ratio between the amounts of the elements deviates to some extent, for example, by 1% or less, insofar as a main phase of the metal oxide is the perovskite structure, such a case falls within the scope of the present invention.

A mole ratio of the element at the A site to the elements at the B site in the general formula (1) described above is 1 to 1. Even when the ratio of the element at the A site is in excess or falls short by a range of −5% to 20%, insofar as a main phase of the metal oxide is the perovskite structure, such a case falls within the scope of the present invention.

It can be determined that the metal oxide has the perovskite structure through, for example, X-ray diffraction or electron diffraction on the piezoelectric film. Insofar as a main crystal phase is the perovskite structure, the piezoelectric film may secondarily include other crystal phases.

(First Auxiliary Component of Piezoelectric Film)

The piezoelectric film includes a first auxiliary component of Mn. A Mn content is 0.002 moles or more and 0.015 moles or less for 1 mole of the perovskite metal oxide.

A first auxiliary component content can be measured through X-ray fluorescence analysis (XRF), ICP-atomic emission spectrometry (ICP-AES), atomic absorption spectroscopy (AAS), or the like. A particularly preferred measurement method is XRF. From contents of metals obtained through composition analysis of the piezoelectric film, elements forming the metal oxide expressed by the general formula (1) are converted to moles, and the total number of moles is taken as 1. In this way, a molar amount of the first auxiliary component can be calculated.

When the piezoelectric film contains Mn in the range described above, a piezoelectric constant at room temperature (25° C.) of the piezoelectric element according to the present invention is improved to suppress a dielectric loss. When the Mn content is less than 0.002 moles, difference in physical properties from a case in which Mn is not contained is small, and thus, the effects described above cannot be fully obtained. On the other hand, when the Mn content is more than 0.015 moles, the dielectric loss of the piezoelectric element steeply increases. When the dielectric loss of the piezoelectric element is, for example, more than 0.015 (measurement frequency of 1 kHz), there are problems in that heat is generated and that power consumption increases when the piezoelectric element is used.

Mn is not limited to metal Mn. It is enough that Mn is contained in the piezoelectric film as a Mn component, and how Mn is contained does not matter. For example, Mn may be in a solid solution at the B site, or may be contained in a grain boundary. Alternatively, the Mn component may be contained in the piezoelectric film in the form of metal, ions, an oxide, a metal salt, a complex, or the like. Mn can generally exhibit valences of 4+, 2+, and 3+.

(Second Auxiliary Component of Piezoelectric Film)

The second auxiliary component of the piezoelectric film is Bi. A Bi content for 1 mole of the metal oxide is 0.00042 moles or more and 0.00850 moles or less.

When the piezoelectric film according to the present invention contains Bi in the range described above, trivalent Bi is thought to be mostly located at the A site and partly located in the grain boundary. When Bi is located at the A site, a phase transition temperature $T_{to}$ from a tetragonal crystal to an orthorhombic crystal moves to a lower side. This action is opposite to action caused by Zr being contained in the piezoelectric film.

Therefore, there is hitherto an upper limit to a Zr amount necessary for setting the phase transition temperature $T_{to}$ in the vicinity of room temperature. However, through adding of Zr together with Bi, a larger amount of Zr can be contained.

When the Bi content is less than 0.00042 moles, in order to cause the phase transition temperature $T_{to}$ to come closer to room temperature for the purpose of improving piezoelectric properties of the piezoelectric film containing Bi, the Zr amount is to be reduced. However, such a piezoelectric film low in Zr content has a high Curie temperature $T_c$ and a low permittivity, and thus, has low piezoelectric properties in the vicinity of room temperature.

On the other hand, when the Bi content is more than 0.00850 moles, a Bi solid solubility limit for the perovskite metal oxide is exceeded, and thus, under the influence of remaining Bi, the piezoelectric properties are not sufficient, which is not preferred. From the viewpoint of obtaining a more preferred piezoelectric constant in a room temperature region, it is more preferred that the Bi content be 0.0020 moles or more and 0.0085 moles or less.

Bi as the second auxiliary component is not limited to metal Bi. It is enough that Bi is contained in the piezoelectric film as a Bi component, and how Bi is contained does not matter. However, it is preferred that Bi as the second auxiliary component be solid solved at the A site as trivalent Bi. A valence of Bi can be specified through X-ray absorption fine structure measurement (XAFS) using radiated light.

(Principal Component and Auxiliary Component of Piezoelectric Film)

When the piezoelectric film forming the piezoelectric element according to the present invention contains the first auxiliary component Mn and the second auxiliary component Bi in the general formula (1) at the same time, the majority of trivalent Mn as the first auxiliary component is located at the B site and the majority of trivalent Bi as the second auxiliary component is located at the A site of the perovskite skeleton. Originally, $Bi^{3+}$ ions can be located both at the A site and at the B site, but $Mn^{3+}$ ions are preferentially located at the B site and the amount of existing $Mn^{3+}$ and the amount of existing $Bi^{3+}$ are almost the same, and thus, $Bi^{3+}$ is to be located at the A site.

When $Bi^{3+}$ is located at the A site, under the influence of lone pairs of $Bi^{3+}$ ions, the tetragonal crystal structure is stabilized. As a result, the phase transition temperature $T_{to}$ of the principal component of the piezoelectric film becomes lower.

From this, in order to raise the phase transition temperature $T_{to}$, which causes the phase to change from the tetragonal crystal phase to the orthorhombic crystal phase, from −30° C. to above 50° C. (in an operating temperature range of a piezoelectric device), it is necessary to increase the amount of Zr having the effect of raising the phase transition temperature $T_{to}$. Increase in the Zr amount can reduce the difference between the Curie temperature $T_c$ and the phase transition temperature, and thus, an electromechanical coupling coefficient k in the orthorhombic crystal becomes higher. Therefore, at room temperature (25° C.) at which the orthorhombic crystal exists, the piezoelectric constant is improved and the effect of suppressing a dielectric loss (also referred to as a dielectric loss tangent or tan δ) is enhanced.

In the general formula (1) described above, x representing the mole ratio of Zr at the B site is in the range of $0.02 \leq x \leq 0.13$. When x is larger than 0.13, a temperature necessary for crystallization is too high, and thus, grain growth is insufficient and the dielectric loss tangent becomes larger. When x is smaller than 0.02, sufficient piezoelectric properties cannot be obtained in the device operating temperature range.

A method of measuring the composition of the piezoelectric film according to the present invention is not particularly limited. Exemplary methods include X-ray fluorescence analysis (XRF), ICP-atomic emission spectrometry (ICP-AES), and atomic absorption spectroscopy (AAS). In any one of those methods, weight ratios and composition ratios of elements contained in the piezoelectric film can be calculated. A particularly preferred method of measuring the composition is XRF.

(Other Auxiliary Components of Piezoelectric Film)

The piezoelectric film described above may contain Ca or Sr to such an extent that such element(s) may be contained in a commercially available material of Ba as an inevitable component, Nb to such an extent that Nb may be contained in a commercially available material of Ti as an inevitable component, and Hf to such an extent that Hf may be contained in a commercially available material of Zr as an inevitable component.

It is preferred that the piezoelectric film contain the perovskite metal oxide expressed by the general formula (1) and the first auxiliary component such that a total amount thereof is 98.5 mol % or more. Further, it is preferred that the piezoelectric film contain the perovskite metal oxide expressed by the general formula (1) as the principal component by 95 mol % or more.

(Thickness of Piezoelectric Film)

It is preferred that a maximum film thickness $T_P$ of the piezoelectric film 103 at a portion sandwiched between the first electrode 102 and the second electrode 104 be 10 µm or less. When the film is not planar, the film thickness is measured in a perpendicular direction with the surface of the substrate 101 being a base point. A more preferred upper limit and a more preferred lower limit of the maximum film thickness $T_P$ are 5,000 nm and 500 nm, respectively. Through setting of the maximum film thickness $T_P$ of the piezoelectric film 103 to be 500 nm or more and 5,000 nm or less, functions of the piezoelectric element can be achieved, and processability of the piezoelectric film for forming an element can be attained.

It is more preferred that the maximum film thickness $T_P$ of the piezoelectric film 103 be 700 nm or more and 4,000 nm or less, and it is further preferred that the maximum film thickness $T_P$ of the piezoelectric film 103 be 1,000 nm or more and 3,500 nm or less.

The maximum film thickness $T_P$ of the piezoelectric film 103 can be measured with a contact profilometer or through observation of a section thereof under a microscope.

FIG. 1C is an illustration of a case in which the maximum film thickness $T_P$ of the piezoelectric element according to the present invention having the patterned piezoelectric film 103 is specified.

(Electrode Thickness)

It is preferred that an average $(T_{E1}+T_{E2})/2$ nm of a maximum film thickness $T_{E1}$ nm and a minimum film thickness $T_{E2}$ nm of the first electrode 102 and the second electrode 104 be in the range of $0.002 \times T_P$ nm $\leq (T_{E1}+T_{E2})/2$ nm $\leq 500$ nm. The maximum film thickness $T_{E1}$ nm and the minimum film thickness $T_{E2}$ nm are determined in a region in which the first electrode 102 and the second electrode 104 are opposed to each other with the piezoelectric film sandwiched therebetween. Therefore, when there is a dummy electrode having nothing to do with the function of the piezoelectric element, a film thickness thereof is not considered. $T_{E1}$ nm is specified by selecting the larger one of the maximum film thickness of the first electrode 102 and the maximum film thickness of the second electrode 104. $T_{E2}$ nm is specified by selecting the smaller one of the minimum film thickness of the first electrode 102 and the minimum film thickness of the second electrode 104. The maximum and minimum film thicknesses of the electrodes can be measured through observation of sections thereof under a microscope.

FIG. 1C is an illustration of a case in which the maximum film thickness $T_{E1}$ nm and the minimum film thickness $T_{E2}$ nm of the piezoelectric element according to the present invention having the patterned second electrode 104 are specified. In this case, the first electrode 102 is in the form of a planar film, and both the film thickness of the first electrode 102 and the film thickness of the second electrode 104 are between $T_{E1}$ nm and $T_{E2}$ nm.

A lower limit of the average $(T_{E1}+T_{E2})/2$ nm is $0.002 \times T_P$ nm, that is, 0.2% of the maximum film thickness $T_P$ of the piezoelectric film 103. For example, if $T_P$=5,000 nm, then the lower limit of $(T_{E1}+T_{E2})/2$ nm is 10 nm. When this condition is satisfied, the electrodes have a resistance value that is uniform irrespective of the locations thereof and a voltage applied to the piezoelectric element becomes more uniform, which is more preferred.

An upper limit of the average $(T_{E1}+T_{E2})/2$ nm is 500 nm. When this condition is satisfied, the possibility that the electrodes prevent a strain on the piezoelectric element from being caused or from being detected can be reduced, which is more preferred.

In the case of the second mode of the piezoelectric element, it is preferred that the average $(T_{E1}+T_{E2})/2$ nm of the maximum film thickness $T_{E1}$ nm and the minimum film thickness $T_{E2}$ nm of the comb electrodes 105 be in the range of $0.002 \times T_P$ nm $\leq (T_{E1}+T_{E2})/2$ nm $\leq 500$ nm.

(Adhesion Component)

It is preferred that an adhesion component containing a metal of Group 4 elements and/or Group 5 elements exists between the first electrode and the substrate. FIG. 2A and FIG. 2B are schematic sectional views of the piezoelectric element according to the present invention when an adhesion component 106 exists between the substrate 101 and the first electrode 102. The adhesion component may exist so as to be dispersed in a dot-like manner and so as to be embedded in the first electrode 102 as the adhesion component 106 illustrated in FIG. 2A, or may be in the shape of a layer having a thickness of 1 nm or more and 10 nm or less as the adhesion component 106 in the shape of a layer illustrated in FIG. 2B. It is preferred that a material of the adhesion component 106 be a single-component metal, an oxide, or a nitride of Ti, Zr, or Hf of Group 4 elements, or be a single-component metal, an oxide, or a nitride of V, Nb, or Ta of Group 5 elements from the viewpoint of adhesion. Part or the entirety of the adhesion component 106 may be chemically bonded to the substrate 101 or the first electrode 102 to form an alloy or a complex oxide.

(Crystal Structure of Piezoelectric Film)

The piezoelectric film 103 according to the present invention is a thin film-like crystalline aggregate, and it is preferred that the crystalline aggregate have an aggregate structure formed of grains each having a columnar structure. FIG. 2C is a schematic sectional view of a piezoelectric element having an aggregate structure formed of grains each having a columnar structure in the piezoelectric film 103. In FIG. 2C, each of the shaded region and the unshaded region in the piezoelectric film 103 indicates a grain having a columnar structure. That a grain is a columnar crystal can be confirmed through observation of a section of the piezoelectric film portion of the piezoelectric element under a microscope. In most cases, a grain having a columnar structure and another grain adjacent to that grain have crystal orientations different from each other, and thus, a grain boundary can be determined from contrast in an image under a microscope. An aggregate structure refers to a state in which at least two grains are adjacent to each other, and it is preferred that substantially an entire region of a section of the piezoelectric film 103 be formed of an aggregate of columnar crystals. It is preferred that a grain having a columnar structure be a single grain in contact with both the first electrode 102 and the second electrode 104. In the case of the second mode of the piezoelectric element as illustrated in FIG. 15A, it is preferred that a grain be a single grain in contact with both the substrate 101 and the comb electrode 105.

It is preferred that a grain size on the surface of the piezoelectric film 103 be 300 nm or more and 5,000 nm or less as an average equivalent circle diameter. When this condition is satisfied, the piezoelectric constant of the piezoelectric element at room temperature (25° C.) becomes more sufficient, which is preferred. On the other hand, when the grain size is 5,000 nm or less, the processability of the thin film piezoelectric element is satisfactory, which is preferred. The "equivalent circle diameter" used herein refers to a "projected area equivalent circle diameter" that is generally mentioned in a microscopic observation method and indicates a diameter of a perfect circle having the same area as a projected area of the crystal grain. In the present invention, the method of measuring the equivalent circle diameter is not particularly limited. For example, the equivalent circle diameter can be determined by photographing a surface of the piezoelectric material using a polarizing microscope or a scanning electron microscope, and by performing image processing on the obtained photographic image. The optimum magnification varies depending on the particle diameter to be observed, and hence an optical microscope or an electron microscope may be used appropriately. An equivalent circle diameter may be determined from an image of a polished surface or a section instead of a surface of a material. An average equivalent circle diameter refers to an average of equivalent circle diameters of a plurality of grains.

(Curie Temperature)

It is preferred that the piezoelectric film in the piezoelectric element according to the present invention have a Curie temperature of 100° C. or higher. When the piezoelectric film has a Curie temperature of 121° C. or higher, that can be said to be sufficiently separate from the operating temperature range of the piezoelectric device (−30° C. to 50° C.). Thus, the influence of abrupt temperature change on the piezoelectric constant and the dielectric loss of the piezoelectric element in the vicinity of the Curie temperature can be neglected in the operating temperature range of the piezoelectric device.

A more preferred range of the Curie temperature of the piezoelectric film is 120° C. or higher and 195° C. or lower. When the temperature is the Curie temperature or higher, piezoelectricity of a piezoelectric material disappears. As used herein, the Curie temperature refers to a temperature at which a capacitance is at a maximum in the vicinity of the phase transition temperature between a ferroelectric phase (tetragonal crystal phase) and a paraelectric phase (cubic crystal phase). The capacitance is measured through, for example, application of a minute AC electric field having a frequency of 1 kHz using an impedance analyzer.

(Orientation)

It is preferred that a crystal forming the perovskite structure of the piezoelectric film in the piezoelectric element according to the present invention be selectively oriented in the direction perpendicular to the surface of the substrate. With regard to an orientation plane, it is preferred that a crystal be selectively oriented in a (100) plane, a (110) plane, or a (111) plane when a unit cell of the perovskite structure is regarded as a pseudo cubic crystal.

"Selectively oriented in an (hkl) plane" as used herein refers to a state in which a degree of orientation in the (hkl) plane is higher than degrees of orientation in other planes. This can also be described as "preferentially oriented in the (hkl) plane" and also includes a state in which a crystal is completely oriented in the (hkl) plane as in the case of a monocrystal.

When the piezoelectric film is oriented in the (100) plane, the (110) plane, or the (111) plane, a direction of polarization moment aligns with a direction of the strain on the piezoelectric film, and thus, the piezoelectric constant at each temperature increases.

The state of orientation of the piezoelectric film can be easily confirmed from a detected angle and a strength of a diffraction peak in X-ray diffraction measurement that is generally used for a crystal thin film (for example, 2θ/θ method). For example, in a diffraction chart obtained from a piezoelectric film oriented in any one of the planes, a strength of a diffraction peak detected at an angle corresponding to the plane is exceedingly higher than a total of strengths of peaks detected at angles corresponding to other planes.

(Method of Manufacturing Piezoelectric Film)

A method of manufacturing the piezoelectric film 103 is not particularly limited. Exemplary methods include CSD, sputtering, hydrothermal synthesis, aerosol deposition, and metal organic chemical vapor deposition (MOCVD). Among those methods, CSD and sputtering are preferred manufacturing methods, and are excellent in controlling the composition of the piezoelectric film.

Exemplary formation of the piezoelectric film 103 by CSD is as follows. A first step is preparing a precursor coating liquid containing at least Ba, Bi, Ti, Zr, and Mn. As a solvent, an organic solvent such as an alcohol-based one is often used. For assisting solution or dispersion of the metal components, the metal components are contained in the coating liquid in the form of an alkoxide, a nitrate, or the like. A second step is forming a film of the coating liquid on a surface of the substrate 101 or the first electrode 102 by spin coating or dip coating and preforming heat treatment. Through repetition of the second step a plurality of times as necessary, the piezoelectric film 103 is obtained. Finally, firing treatment for accelerating crystallization may be performed.

Exemplary formation of the piezoelectric film 103 by sputtering is as follows. A first step is preparing a target material containing at least Ba, Bi, Ti, Zr, and Mn. The metal components may be contained in one target as a sintered body, or may be divided into a plurality of targets each alone or in a mixed state. A second step is placing, in a decompression chamber, the target and the substrate 101 or the substrate 101 having the first electrode 102 formed thereon and causing high energy particles (such as ionized inert gas particles) to collide against a surface of the target to form the intended piezoelectric film 103 on the surface of the substrate 101 or the first electrode 102. For the purpose of accelerating crystallization, the substrate 101 may be heated in the chamber, or heat treatment may be performed outside the chamber after the piezoelectric film is formed.

(Piezoelectric Actuator)

A piezoelectric actuator according to the present invention includes the piezoelectric element according to the present invention and a diaphragm formed in contact with the piezoelectric element.

Figure 3A:
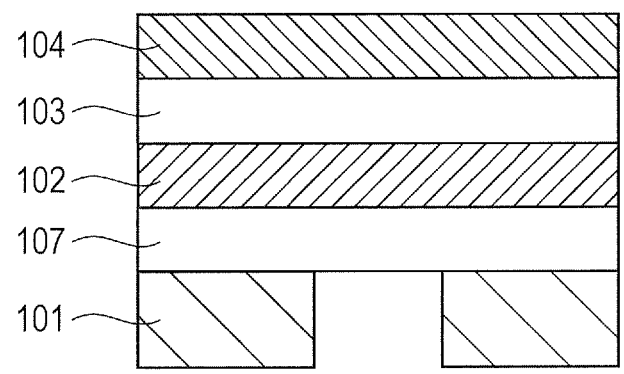
FIG. 3A and FIG. 3B are a schematic sectional view and a schematic rear view, respectively, for illustrating a configuration of a piezoelectric actuator according to an embodiment of the present invention.
Figure 3B:
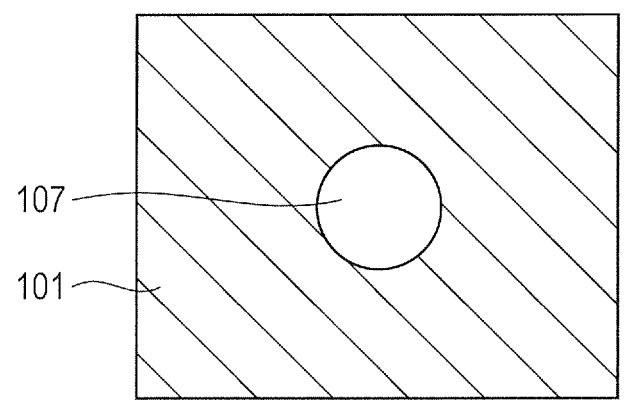

FIG. 3A and FIG. 3B are a schematic sectional view and a schematic rear view, respectively, for illustrating a piezoelectric actuator according to an embodiment of the present invention. In the case illustrated in FIG. 3A and FIG. 3B, a diaphragm 107 is formed in contact with the first electrode 102 and the substrate 101 of the piezoelectric element according to the present invention.

The diaphragm 107 has a thickness of 1.0 µm or more and 15 µm or less. A more preferred thickness thereof is 1.5 µm or more and 8 µm or less.

A material forming the diaphragm 107 is not particularly limited, and a metal material, a metal oxide material, a glass-based material, or the like is used. A more preferred material of the diaphragm 107 is $SiO_2$ (silicon dioxide).

A method of manufacturing the diaphragm 107 is not particularly limited. For example, oxidation treatment may be performed to the substrate 101 to modify the surface thereof, or a material forming the diaphragm 107 may be bonded to the substrate 101. The diaphragm 107 may be formed by CSD, sputtering, hydrothermal synthesis, aerosol deposition, MOCVD, or the like, or a surface portion of the substrate 101 may also serve as the diaphragm 107.

In the piezoelectric actuator according to the present invention, when a voltage is applied between the first electrode 102 and the second electrode 104, the piezoelectric film 103 is deformed. The deformation is amplified by the effect of the diaphragm 107 adhering to the piezoelectric element. As a result, the piezoelectric actuator according to the embodiment illustrated in FIG. 3A and FIG. 3B undergoes displacement to a great extent in a hole portion in the substrate 101. An amount of the displacement can be easily controlled with the voltage and a frequency.

(Liquid Ejection Head)

Next, a liquid ejection head according to the present invention is described.

The liquid ejection head according to the present invention includes at least a liquid chamber including a vibration unit containing the piezoelectric element, and an ejection orifice communicating to the liquid chamber.

Figure 4A:
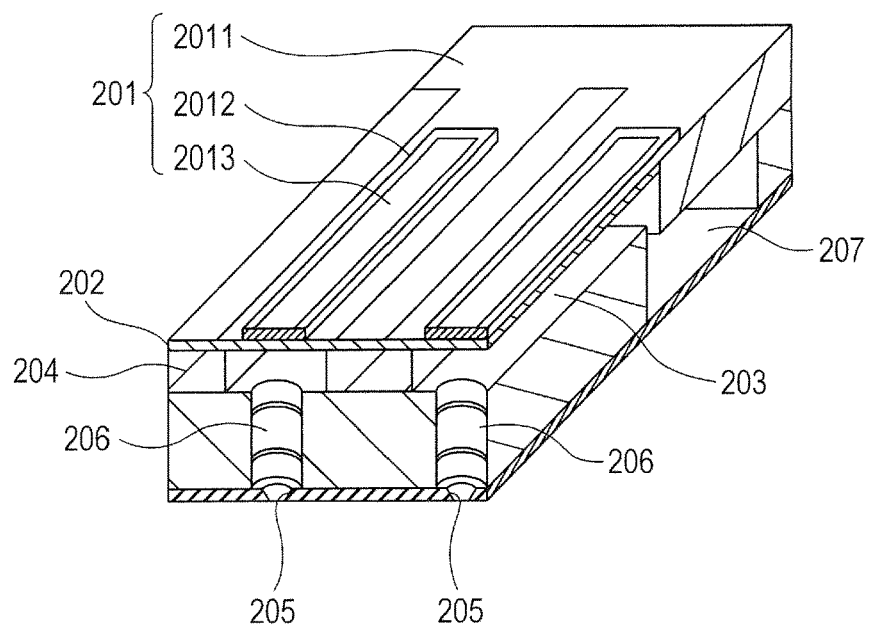
FIG. 4A and FIG. 4B are schematic views for illustrating configurations of a liquid ejection head and a liquid ejection apparatus according to embodiments, respectively, of the present invention.

FIG. 4A is a schematic view for illustrating a configuration of the liquid ejection head according to an embodiment of the present invention. Shapes and arrangements of members are not limited to those illustrated in FIG. 4A. A piezoelectric element 201 includes at least a first electrode 2011, a piezoelectric film 2012, and a second electrode 2013. In the case illustrated in FIG. 4A, a substrate as one member forming the piezoelectric element according to the present invention also serves as a liquid chamber division wall 204. The piezoelectric film 2012 and the second electrode 2013 are patterned for the purpose of enhancing ejection force of the liquid ejection head. The liquid ejection head includes ejection orifices 205, individual liquid chambers 203, communicating holes 206 connecting the individual liquid chambers 203 and the ejection orifices 205, respectively, the liquid chamber division wall 204, a common liquid chamber 207, a diaphragm 202, and piezoelectric elements 201. An adhesion component may exist between the diaphragm 202 and the first electrode 2011. A material and a thickness suitable for the diaphragm 202 are similar to those for the diaphragm in the piezoelectric actuator.

In the liquid ejection head of the present invention, the diaphragm 202 vertically vibrates owing to the deformation of the piezoelectric element 201 to apply a pressure to liquid stored in the individual liquid chamber 203. As a result, the liquid is ejected from the ejection orifice 205. The liquid ejection head of the present invention can be used in a printer application or the production of an electronic device.

(Liquid Ejection Apparatus)

Next, a liquid ejection apparatus of the present invention is described. The liquid ejection apparatus of the present invention includes a mounting unit of a transfer target, and the liquid ejection head.

Figure 4B:
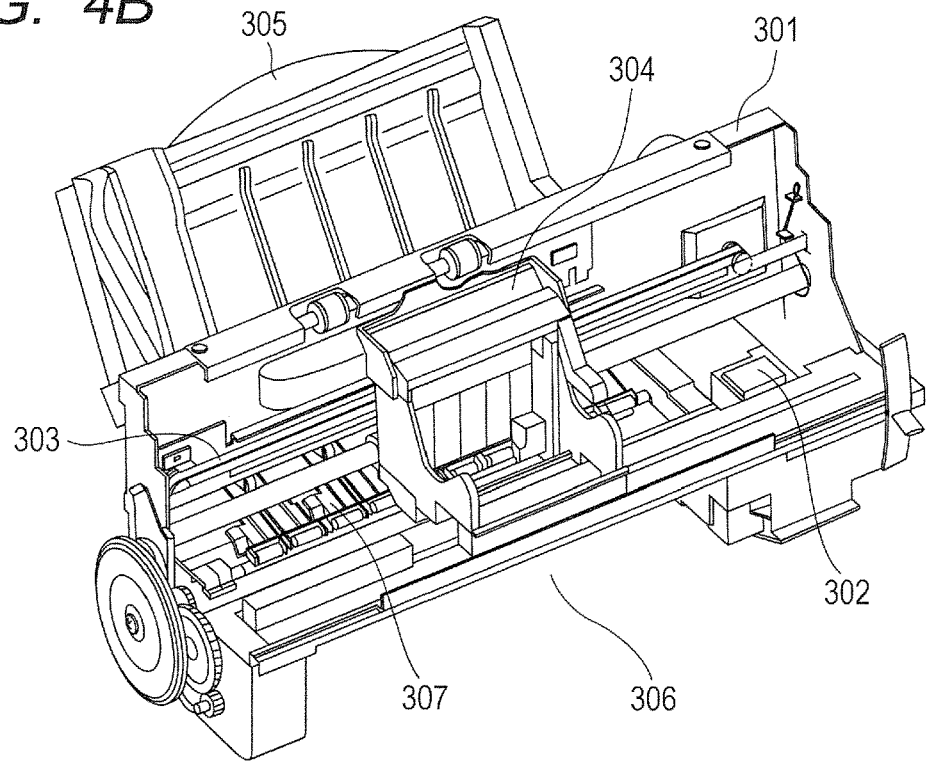

An ink jet recording apparatus illustrated in FIG. 4B is an exemplary liquid ejection apparatus according to the present invention. In the ink jet recording apparatus (liquid ejection apparatus), mechanisms are incorporated into an exterior unit 301. An automatic feeding unit 305 has a function of automatically feeding a recording sheet as a transfer target into an apparatus body. The recording sheet fed from the automatic feeding unit 305 is introduced by a conveying unit 307 to a predetermined recording location (no reference number), and, after recording operation, is again introduced by the conveying unit 307 from the recording location to a discharge unit 306. The conveying unit 307 corresponds to a placing unit for a transfer target. In addition, the ink jet recording apparatus includes a recording unit 303 configured to perform recording on the recording sheet conveyed to the recording location and a recovering unit 302 configured to conduct recovery processing for the recording unit 303. The recording unit 303 includes a carriage 304 configured to house the liquid ejection head therein and to reciprocate the liquid ejection head on a rail.

In the ink jet recording apparatus described above, the carriage 304 conveys the liquid ejection head under instruction from an external computer and ink is ejected through ejection orifices of the liquid ejection head based on a voltage applied to the piezoelectric film, to thereby perform printing.

In the above, a case of an ink jet recording apparatus is described, but the liquid ejection apparatus according to the present invention can be used as, other than printing apparatus such as ink jet recording apparatus including a facsimile machine, a multifunction device, and a copying machine, an industrial liquid ejection apparatus and a device for drawing a picture on a target. In addition, a user can select a desired transfer target depending on a use.

(Shake Correction Mechanism)

Next, a shake correction mechanism according to the present invention is described. The shake correction mechanism according to the present invention includes two or more piezoelectric actuators described above, and the piezoelectric actuators are arranged such that, when a voltage is applied thereto, the piezoelectric actuators expand and contract in two or more directions.

The shake correction mechanism has such a configuration, and thus, influence of a shake applied from the outside while a transport target is transported can be reduced.

Figure 5:
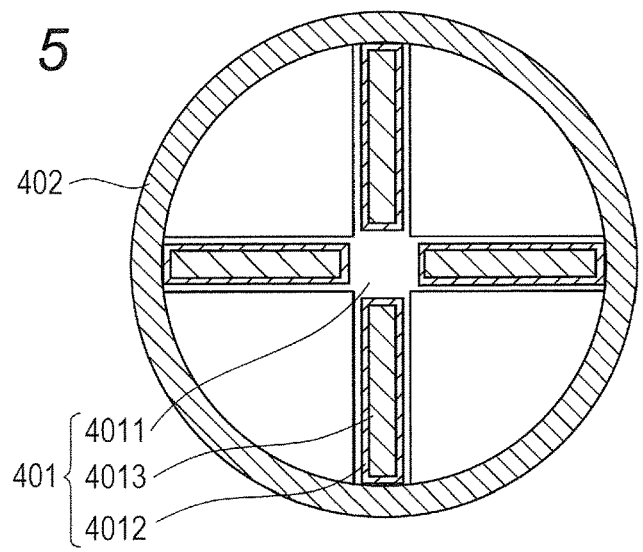
FIG. 5 is a schematic view for illustrating a configuration of a shake correction mechanism according to an embodiment of the present invention.

FIG. 5 is a schematic view for illustrating a configuration of the shake correction mechanism according to the present invention. Shapes and arrangements of members are not limited to those illustrated in FIG. 5. The shake correction mechanism according to the present invention includes at least two piezoelectric actuators 401 and a transfer target 402. Each of the piezoelectric actuators 401 has structure in which a diaphragm 4011 also serving as a substrate, a first electrode (in FIG. 5, unseen at the back of a piezoelectric film (no reference number)), a piezoelectric film 4012, and a second electrode 4013 are laminated in this order. In the case illustrated in FIG. 5, a plurality of piezoelectric elements are arranged on a cross-shaped common substrate. It is herein assumed that the shake correction mechanism has four piezoelectric actuators 401 based on the number of the piezoelectric elements. When an alternating voltage is applied to the four piezoelectric actuators 401 illustrated in FIG. 5 from an external voltage source, each of the piezoelectric actuators 401 expands and contracts in a longitudinal direction of the piezoelectric film. Specifically, the piezoelectric actuators 401 expand and contract in two directions orthogonal to each other to transfer shakes to the transfer target 402 in contact with the diaphragm 4011. Through combination of shakes in the two directions, rotational motion of the transfer target 402 can be caused. When the rotational motion is caused so as to have a reverse phase with respect to the shake applied from the outside, adverse influence of the shake applied from the outside can be reduced.

The transfer target 402 may be a functional member that may be adversely influenced by a shake applied from the outside, e.g., an optical member such as a lens or a mirror, or may be a connecting member configured to transfer the shake to the functional member.

(Variable Shape Optical Element)

Next, a variable shape optical element according to the present invention is described. The variable shape optical element according to the present invention includes the piezoelectric actuators described above and an optical member dynamically connected to the piezoelectric actuators, and has a mechanism for changing a shape of the optical member through deformation of the piezoelectric actuators.

Figure 6A:
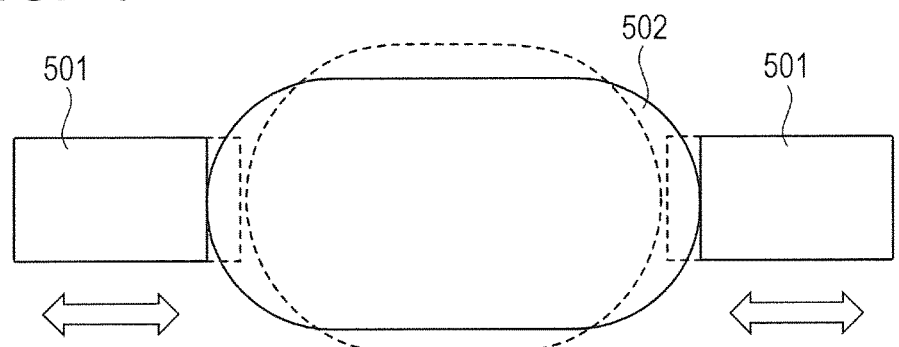
FIG. 6A and FIG. 6B are schematic views for illustrating configurations of a variable shape optical element and a movable optical member according to embodiments, respectively, of the present invention.

FIG. 6A is a schematic view for illustrating a configuration of the variable shape optical element according to the present invention. Shapes and arrangements of members are not limited to those illustrated in FIG. 6A. The variable shape optical element according to the present invention includes piezoelectric actuators 501 and an optical member 502 whose shape is changed under the influence of deformation of the piezoelectric actuators 501. In the case illustrated in FIG. 6A, the piezoelectric actuators 501 and the optical member 502 are in contact with each other, thereby achieving dynamic connection between each of the piezoelectric actuators 501 and the optical member 502, but an intermediate member having a function of transferring deforming of the piezoelectric actuators 501 may be arranged between each of the piezoelectric actuators 501 and the optical member 502. Arrows in FIG. 6A are for illustrating expansion and contraction of the piezoelectric actuators 501, and are not members. In the case illustrated in FIG. 6A, each of the two piezoelectric actuators 501 is dynamically connected to the optical member 502 at one location, but the numbers of the piezoelectric actuators 501 and the optical member 502 and connecting locations are not limited thereto. The optical member 502 is a member having a function of acting on properties of an optical path or a light beam such as a lens, a filter, or a mirror. For example, when a lens having a refractive index that is higher than that of air is used as the optical member 502, the shape of the optical member 502 can be changed depending on deformation of the piezoelectric actuators 501 to control a refracting angle of light passing through the lens.

(Movable Optical Member)

Next, a movable optical member according to the present invention is described. The movable optical member according to the present invention includes the piezoelectric actuators described above and an optical member dynamically connected to the piezoelectric actuators, and has a mechanism for moving and/or rotating the optical member through deformation of the piezoelectric actuators.

Figure 6B:
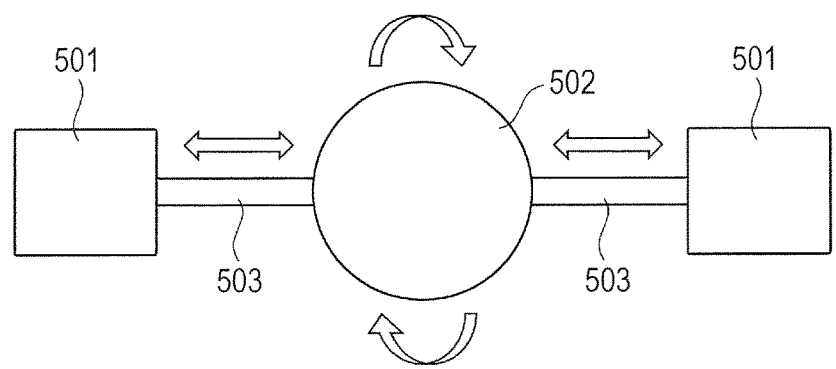

FIG. 6B is a schematic view for illustrating a configuration of the movable optical member according to the present invention. Shapes and arrangements of members are not limited to those illustrated in FIG. 6B. The movable optical member according to the present invention includes the piezoelectric actuators 501, the optical member 502 configured to be moved or rotated under the influence of deformation of the piezoelectric actuators 501, and piezoelectric strain transfer units 503 configured to move or rotate the optical member 502 depending on deformation of the piezoelectric actuators 501.

In the case illustrated in FIG. 6B, the piezoelectric actuators 501 are in contact with the piezoelectric strain transfer units 503, respectively, and the piezoelectric strain transfer units 503 are in contact with the optical member 502, thereby making dynamic connection between each of the piezoelectric actuators 501 and the optical member 502. However, another intermediate member may be arranged between each of the piezoelectric actuators 501 and the optical member 502. Arrows in FIG. 6B are for illustrating movement or rotation of the optical member 502, and are not members. The optical member 502 is a member having the function of acting on properties of an optical path or a light beam such as a lens, a filter, or a mirror. For example, when a mirror is used as the optical member 502, coordinates and an angle of the optical member 502 can be changed depending on deformation of the piezoelectric actuators 501 to control a direction of light reflected by the mirror.

(Optical Device)

Next, an optical device of the present invention is described.

A first mode of the optical device according to the present invention includes the shake correction mechanism, and an optical member held by the shake correction mechanism.

Figure 7A:
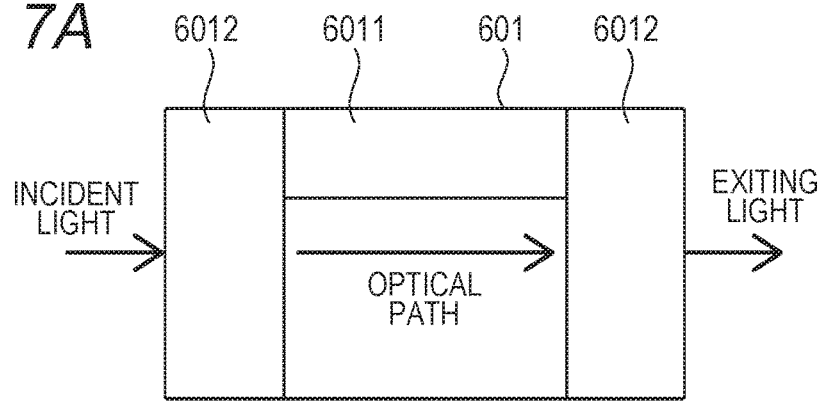
FIG. 7A, FIG. 7B, and FIG. 7C are schematic views for illustrating configurations of optical devices according to embodiments, respectively, of the present invention.

FIG. 7A is a schematic view for illustrating a configuration of the optical device according to the present invention. The numbers and arrangements of members are not limited to those illustrated in FIG. 7A. An optical device 601 according to the present invention includes a shake correction mechanism 6011 and optical members 6012 as transport targets of the shake correction mechanism 6011. A lens barrel connected to an image pickup apparatus when used is an example of the optical device 601. In this case, the optical members 6012 are lenses. There is a problem in that, when a shake such as a hand-induced shake is applied from the outside to the optical device used as the lens barrel, an optical path of exiting light fluctuates during exposure time of the image pickup apparatus. This problem can be solved through suppression by the shake correction mechanism 6011 of coordinate fluctuations of the optical members 6012. As illustrated in FIG. 7A, it is preferred that the shake correction mechanism 6011 be arranged at a location at which the shake correction mechanism 6011 does not interfere with the optical path passing through the optical members 6012.

A second mode of the optical device according to the present invention includes the variable shape optical element described above.

Figure 7B:
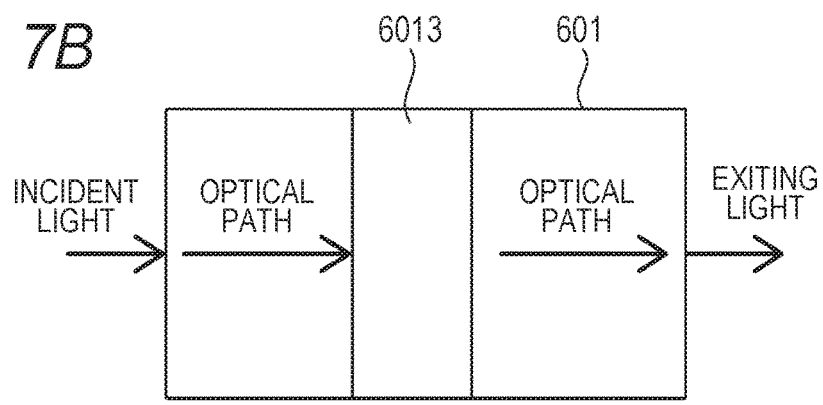

FIG. 7B is a schematic view for illustrating a configuration of the optical device according to the present invention. The optical device 601 according to the present invention includes a variable shape optical element 6013. The number and arrangement of the variable shape optical element 6013 are not limited to those illustrated in FIG. 7B. A lens barrel connected to an image pickup apparatus when used is an example of the optical device. In this case, the variable shape optical element 6013 is a variable lens. When a variable lens whose optical path can be controlled by a piezoelectric actuator is used, there is an effect that the number of lenses used in the lens barrel can be reduced. As illustrated in FIG. 7B, it is preferred that the variable shape optical element 6013 be arranged on an optical path of light incident on and exiting from the optical device 601.

A third mode of the optical device according to the present invention includes the movable optical member described above.

Figure 7C:
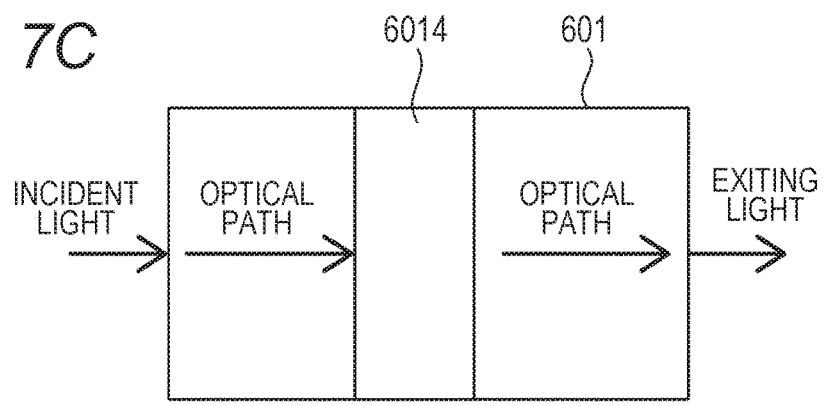

FIG. 7C is a schematic view for illustrating a configuration of the optical device according to the present invention. The optical device 601 according to the present invention includes at least a movable optical member 6014. The number and arrangement of the movable optical member 6014 are not limited to those illustrated in FIG. 7C. A lens barrel connected to an image pickup apparatus when used is an example of the optical device. In this case, the movable optical member 6014 is a movable lens or a movable mirror. When a movable lens or a movable mirror whose optical path can be controlled by a piezoelectric actuator is used, there is an effect that the number of lenses used in the lens barrel can be reduced. As illustrated in FIG. 7C, it is preferred that the movable optical member 6014 be arranged on an optical path of light incident on and exiting from the optical device 601.

(Image Pickup Apparatus)

Next, an image pickup apparatus according to the present invention is described.

The image pickup apparatus according to the present invention includes the shake correction mechanism described above, and an image pickup element unit held by the shake correction mechanism.

Figure 8:
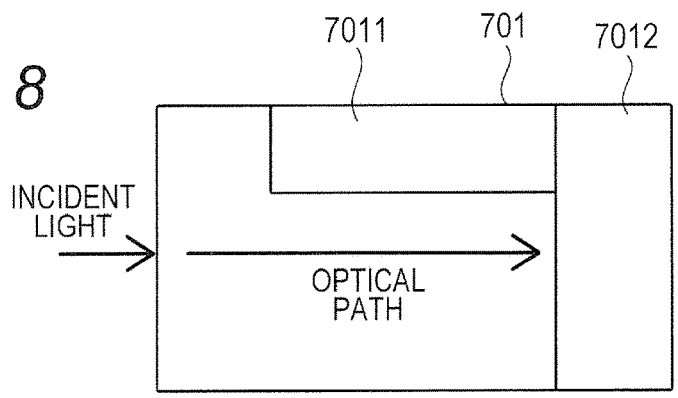
FIG. 8 is a schematic view for illustrating a configuration of an image pickup apparatus according to an embodiment of the present invention.

FIG. 8 is a schematic view for illustrating a configuration of the image pickup apparatus according to the present invention. An image pickup apparatus 701 according to the present invention includes a shake correction mechanism 7011 and an image pickup element unit 7012 as a transport target of the shake correction mechanism 7011. The image pickup element unit 7012 is, for example, an electronic substrate having an image pickup element and an electrical element mounted thereon. Exemplary image pickup elements include a charge-coupled device (CCD) and a complementary metal oxide semiconductor (CMOS).

There is a problem in that, when a shake such as a hand-induced shake is applied from the outside to the image pickup element unit 7012, image pickup data fluctuates during exposure time. This problem can be solved through suppression by the shake correction mechanism 7011 of coordinate fluctuations of the image pickup element unit 7012. As illustrated in FIG. 8, it is preferred that the shake correction mechanism 7011 be arranged at a location at which the shake correction mechanism 7011 does not interfere with an optical path reaching a light receiving surface of the image pickup element unit 7012.

(Optical Switch)

Next, an optical switch according to the present invention is described.

A first mode of the optical switch according to the present invention includes the variable shape optical element described above.

Figure 9A:
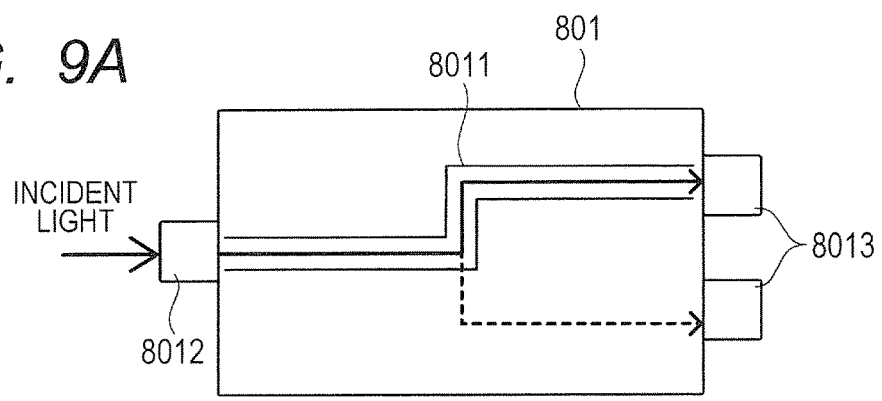
FIG. 9A and FIG. 9B are schematic views for illustrating configurations of optical switches according to embodiments, respectively, of the present invention.

FIG. 9A is a schematic view for illustrating a configuration of the optical switch according to the present invention. The numbers, shapes, and arrangements of members are not limited to those illustrated in FIG. 9A. An optical switch 801 according to the present invention includes a mechanism in which an optical path from an optical signal input terminal 8012 to an optical signal output terminal 8013 is changed under the influence of deformation of a variable shape optical element 8011. FIG. 9A is an illustration of a case in which two optical signal output terminals 8013 are arranged, and, through switching of the optical signal output terminal 8013 that light reaches with the variable shape optical element 8011, on/off operation as a switch can be performed. In the case illustrated in FIG. 9A, the variable shape optical element 8011 includes a material having a light transmission property such as an optical fiber and a piezoelectric actuator.

A second mode of the optical switch according to the present invention includes the movable optical member described above.

Figure 9B:
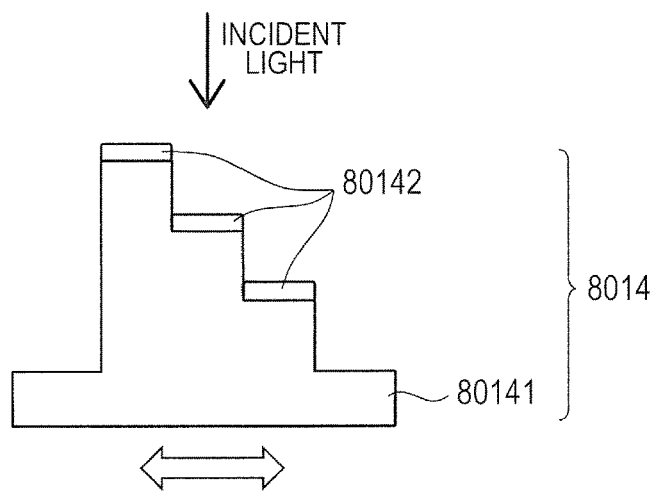

FIG. 9B is a schematic view for illustrating a configuration of the optical switch according to the present invention. The numbers, shapes, and arrangements of members are not limited to those illustrated in FIG. 9B. In the case illustrated in FIG. 9B, a movable optical member 8014 itself that includes a moving unit 80141 and a reflecting unit 80142 is an optical switch, but an optical switch may have a member other than the movable optical member 8014, for example, a slit or the like formed therein that is configured to limit a location irradiated with incident light. The moving unit 80141 is a structure configured to move in a side-to-side direction in FIG. 9B under instructions from an external computer, and the reflecting unit 80142 is formed on surfaces on the incident light side thereof. The reflecting unit 80142 and the moving unit 80141 are coupled to each other, and thus, move together. The reflecting unit 80142 is, for example, mirror surfaces, and has a function of generating reflected light depending on the incident light. When, for example, the movable optical member 8014 moves in the side-to-side direction, coordinates of the reflecting unit 80142 irradiated with the incident light can be changed to change a direction of the reflected light. Using the change in direction of the reflected light, on/off operation as a switch can be performed.

(Micromirror Device)

Next, a micromirror device according to the present invention is described.

The micromirror device according to the present invention includes a plurality of micromirrors and the piezoelectric actuators described above that are dynamically connected to the micromirrors, respectively.

Figure 10:
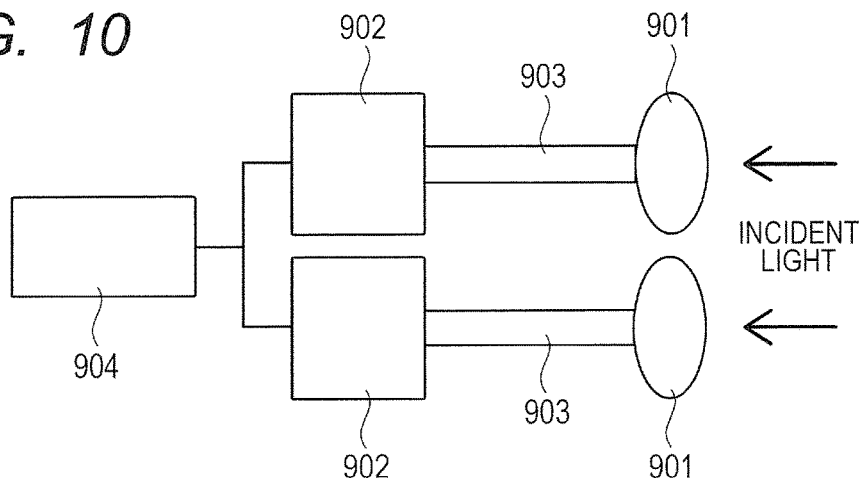
FIG. 10 is a schematic view for illustrating a configuration of a micromirror device according to an embodiment of the present invention.

FIG. 10 is a schematic view for illustrating a configuration of the micromirror device according to the present invention. The numbers, shapes, and arrangements of members are not limited to those illustrated in FIG. 10. In the micromirror device according to the present invention illustrated in FIG. 10, under instruction from a control unit 904, respective piezoelectric actuators 902 are deformed due to piezoelectric effect, directions and magnitudes of the deformation are adjusted by a piezoelectric strain transfer unit 903, and, as a result of those operations, micromirrors 901 are moved or rotated. The function described above enables reflection of light incident on the micromirrors in an arbitrary direction.

(Ultrasonic Wave Probe)

Next, an ultrasonic wave probe according to the present invention is described.

The ultrasonic wave probe according to the present invention includes the piezoelectric actuator described above, and has a function of oscillating an ultrasonic wave and a function of receiving a reflected wave.

Figure 11A:
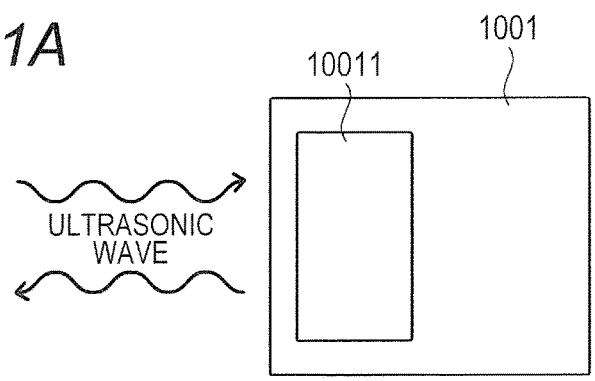
FIG. 11A and FIG. 11B are schematic views for illustrating configurations of an ultrasonic wave probe and an ultrasonograph according to embodiments, respectively, of the present invention.

FIG. 11A is a schematic view for illustrating a configuration of the ultrasonic wave probe according to the present invention. The numbers, shapes, and arrangements of members are not limited to those illustrated in FIG. 11A. An ultrasonic wave probe 1001 according to the present invention illustrated in FIG. 11A includes therein a piezoelectric actuator 10011, and an ultrasonic wave produced due to inverse piezoelectric effect of the piezoelectric actuator 10011 is oscillated (sent) toward a subject. Wavy arrows in FIG. 11A schematically indicate ultrasonic wave propagation, and are not members of the ultrasonic wave probe 1001. The ultrasonic wave is reflected by internal tissue of the subject and returns toward the ultrasonic wave probe 1001 as ultrasonic echoes. Through conversion of vibrations caused by the ultrasonic echoes into electrical signals by the piezoelectric actuator 10011, information on the internal tissue of the subject can be obtained.

The piezoelectric actuator 10011 in charge of oscillation and reception of an ultrasonic wave may be a plurality of piezoelectric actuators, and one of the plurality of piezoelectric actuators may be a unit other than a piezoelectric actuator used in place thereof.

(Ultrasonograph)

Next, an ultrasonograph according to the present invention is described.

The ultrasonograph according to the present invention includes, the ultrasonic wave probe, a signal processing unit, and an image generating unit.

Figure 11B:
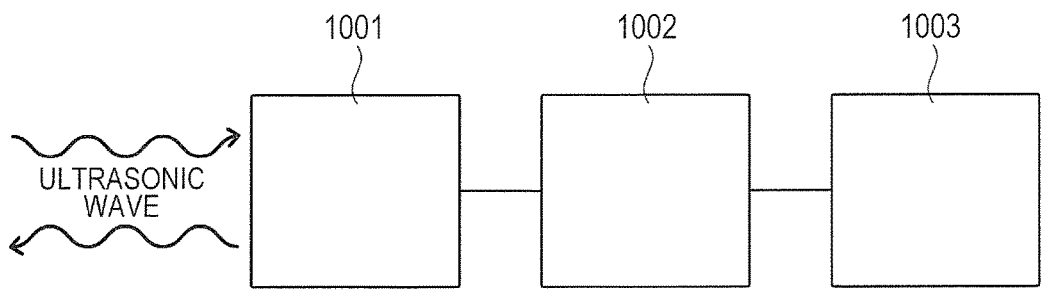

FIG. 11B is a schematic view for illustrating a configuration of the ultrasonograph according to the present invention. The order of connection of members is not limited to that illustrated in FIG. 11B. In the ultrasonograph according to the present invention illustrated in FIG. 11B, an electrical signal caused by a reflected wave received by the ultrasonic wave probe 1001 is subjected to data conversion and data accumulation in a signal processing unit 1002, and conversion into image information is made in an image forming unit 1003. The ultrasonograph also has a function of sending the image information to an external image display unit (display).

(Sound Component)

Next, a sound component according to the present invention is described.

A sound component according to the present invention includes the piezoelectric actuator and is configured to send or receive sound through driving of the piezoelectric actuator.

Figure 12:
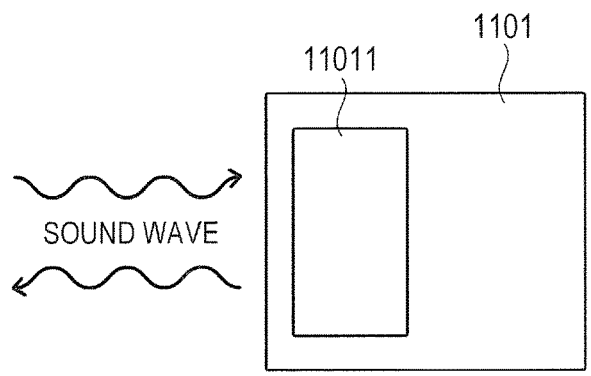
FIG. 12 is a schematic view for illustrating a configuration of a sound component according to an embodiment of the present invention.

FIG. 12 is a schematic view for illustrating a configuration of the sound component according to the present invention. The numbers, shapes, and arrangements of members are not limited to those illustrated in FIG. 12. A sound component 1101 according to the present invention illustrated in FIG. 12 includes therein a piezoelectric actuator 11011, and has a function of sending a sound wave produced due to inverse piezoelectric effect of the piezoelectric actuator 11011 and receiving a sound wave from the outside using direct piezoelectric effect. The sound component 1101 may include a diaphragm configured to amplify a sound wave. Wavy arrows in FIG. 12 schematically indicate sound wave propagation, and are not members of the sound component 1101. Exemplary sound components include a microphone, a speaker, and a buzzer.

(Angular Velocity Sensor)

Next, an angular velocity sensor according to the present invention is described.

The angular velocity sensor according to the present invention includes the piezoelectric element described above, and is configured to convert change in shape of the piezoelectric element into angular velocity information.

Figure 13:
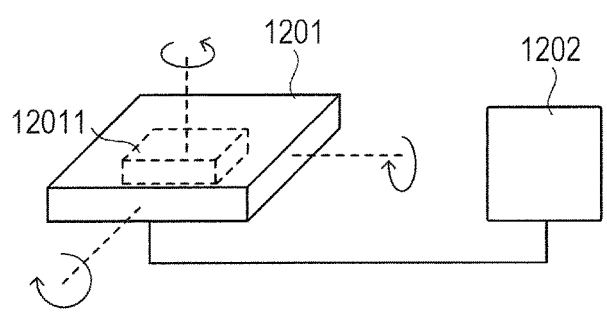
FIG. 13 is a schematic view for illustrating a configuration of an angular velocity sensor according to an embodiment of the present invention.

FIG. 13 is a schematic view for illustrating a configuration of the angular velocity sensor according to the present invention. The numbers, shapes, and arrangements of members are not limited to those illustrated in FIG. 13. An angular velocity sensor 1201 illustrated in FIG. 13 includes therein a piezoelectric element 12011, and a shape of the piezoelectric element 12011 is changed by a Coriolis force caused due to triaxial rotation of a body of the angular velocity sensor 1201. The change in shape of the piezoelectric element 12011 is converted into an electrical signal due to direct piezoelectric effect, and is converted into angular velocity information by a signal processing unit 1202 formed inside or outside the angular velocity sensor 1201. The angular velocity sensor 1201 may include a member other than the piezoelectric element 12011, and, as a configuration thereof, one known as a vibrating angular velocity sensor (gyro sensor) can be applied. Arrows and dotted lines in the vicinity thereof in FIG. 13 schematically indicate directions of the triaxial rotation, and are not members of the angular velocity sensor 1201.

(Vibration Power Generator)

Next, a vibration power generator according to the present invention is described.

The vibration power generator according to the present invention includes the piezoelectric element described above, and is configured to convert vibrational energy into electric energy.

Figure 14:
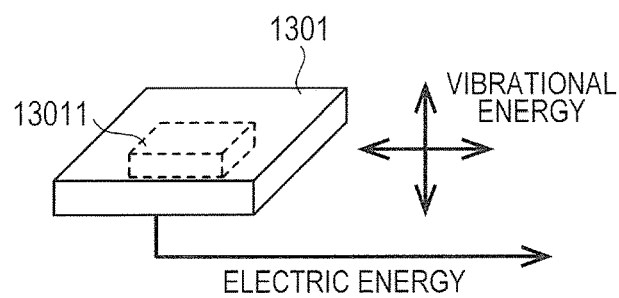
FIG. 14 is a schematic view for illustrating a configuration of a vibration power generator according to an embodiment of the present invention.

FIG. 14 is a schematic view for illustrating a configuration of the vibration power generator according to the present invention. The numbers, shapes, and arrangements of members are not limited to those illustrated in FIG. 14. A vibration power generator 1301 according to the present invention illustrated in FIG. 14 includes therein a piezoelectric element 13011, and has a power generating function of converting vibrational energy from the outside into electric energy using direct piezoelectric effect in the piezoelectric element 13011. The vibration power generator 1301 may include a vibration receiving unit for adjusting a direction and a frequency of vibration from the outside.

(Surface Acoustic Wave Generator)

Next, a surface acoustic wave generator according to the present invention is described.

The surface acoustic wave generator according to the present invention includes the piezoelectric element according to the second mode of the present invention illustrated in FIG. 15A.

Figure 15B:
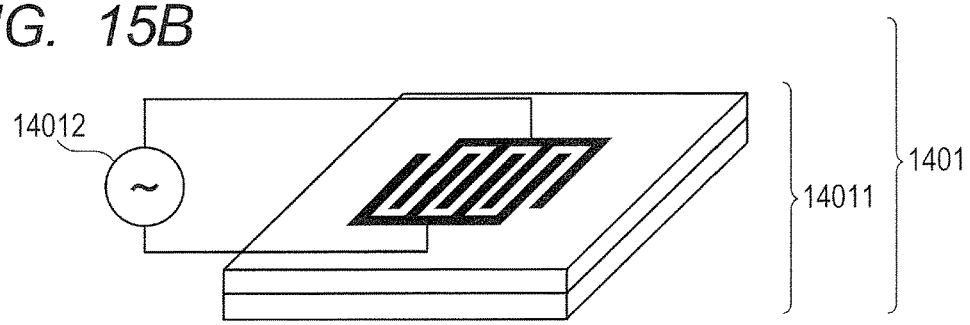
FIG. 15B is a schematic view for illustrating a configuration of a surface acoustic wave generator according to an embodiment of the present invention.

FIG. 15B is a schematic view for illustrating a configuration of the surface acoustic wave generator according to the present invention. The numbers, shapes, and arrangements of members are not limited to those illustrated in FIG. 15B. A surface acoustic wave generator 1401 according to the present invention illustrated in FIG. 15B includes therein a piezoelectric element 14011, and, through application of an alternating voltage by a power supply 14012, a surface acoustic wave is generated between an input side comb interdigital electrode (interdigital transducer: IDT) and an output side comb interdigital electrode. At this time, when a wavelength of the surface acoustic wave is a multiple of a cycle of arranging the IDTs, surface acoustic waves generated at the respective electrodes are in phase with each other, which improves a propagation state.

(Piezoelectric Shutter)

Next, a piezoelectric shutter according to the present invention is described.

The piezoelectric shutter according to the present invention includes the surface acoustic wave generator described above and a light-shielding component, and has a function of moving the light-shielding component by driving the surface acoustic wave generator.

Figure 15C:
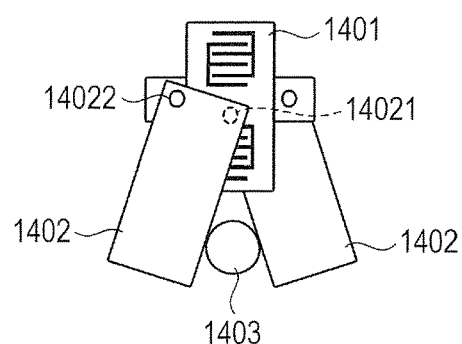
FIG. 15C and FIG. 15D are schematic views for illustrating a configuration of a piezoelectric shutter according to an embodiment of the present invention.
Figure 15D:
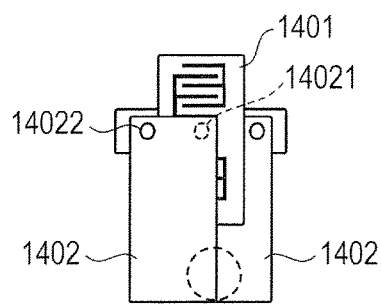

FIG. 15C and FIG. 15D are schematic views for illustrating a configuration of the piezoelectric shutter according to the present invention. The numbers, shapes, and arrangements of members are not limited to those illustrated in FIG. 15C. The piezoelectric shutter according to the present invention illustrated in FIG. 15C includes the surface acoustic wave generator 1401 having a piezoelectric film and an IDT on each surface thereof, and an opaque light-shielding component 1402. The opaque light-shielding component 1402 has a movable protruding portion 14021 as a protruding portion configured to be in friction-contact with both surfaces of the surface acoustic wave generator 1401, and a rotation axis portion 14022 that is mounted to a housing (no reference number) and thus cannot be moved, but is rotatable. A light receiving unit 1403 configured to detect light passing through the piezoelectric shutter is an external member arranged beyond the plane of the drawing sheet, and is not included in the piezoelectric shutter. When an alternating voltage is applied to the surface acoustic wave generator 1401 under a state in which the light receiving unit 1403 is not covered with the light-shielding component 1402 (open location) as illustrated in FIG. 15C to generate a surface acoustic wave that moves the movable protruding portion 14021 toward a top side within the plane of the drawing sheet, the light-shielding component 1402 starts rotational movement about the rotation axis portion 14022, and then, the state is as illustrated in FIG. 15D (closed location). Change from the closed location to the open location can be similarly made through movement of the movable protruding portion 14021 downward.

(Other Uses)

The piezoelectric element and the piezoelectric actuator according to the present invention can be applied to, other than the uses described above, overall piezoelectric devices employing a piezoelectric function. Exemplary uses include various kinds of piezoelectric sensors, ferroelectric memories, frequency filters, and piezoelectric oscillators.

The piezoelectric element according to the present invention is not limited to the embodiments described above, and can be mounted on various electronic apparatus. With an electronic component forming the electronic apparatus and a piezoelectric element formed in relation to the electronic component, an electronic apparatus having excellent properties can be provided.

Now, the present invention is described more specifically by way of examples. However, the present invention is not limited by the following examples.

The piezoelectric element of the present invention was manufactured as described below.

EXAMPLE 1

(Piezoelectric Element)

The piezoelectric element according to the first mode of the present invention was manufactured.

As the first electrode, a platinum electrode having a thickness of 400 nm was formed on a commercially available silicon substrate by DC sputtering. As an adhering layer, a titanium oxide film having a thickness of 30 nm was formed between the first electrode and the silicon substrate.

Then, the piezoelectric film containing Ba, Ti, Zr, Mn, and Bi was formed on the first electrode by CSD.

Specifically, the piezoelectric film containing a material corresponding to a composition $Ba(Ti_{0.960}Zr_{0.040})O_3$ when $x=0.040$ in the general formula (1) of $Ba_a(Ti_{1-x}Zr_x)O_3$, 0.010 moles of Mn element as the first auxiliary component, and 0.0020 moles of Bi element as the second auxiliary component was manufactured as follows.

As the precursor material liquid used in application by CSD, one in which alkoxides of the respective metals are mixed and dispersed in an organic solvent was used. As a Ba material, $Ba(OC_2H_5)_2$ was used. As a Ti material, $Ti(OC_2H_5)_4$ was used. As a Zr material, $Zr(O-n-C_4H_9)_4$ was used. As a Mn material, $Mn(O-i-C_3H_7)_2$ was used. As a Bi material, $Bi(O-i-C_3H_7)_3$ was used. As the organic solvent, 1-methoxy-2-propanol was used, but, when an ordinary organic solvent such as diethylene glycol monoethyl ether, acetylacetone, ethanol, isopropyl alcohol, n-butanol, ethylene glycol, propylene glycol, n-butyl acetate, xylene, toluene, or octane was used for the purpose of enhancing stability and adjusting viscosity of the material liquid, a similar result was obtained. As a stabilizer, 1,8-diazabicyclo[5.4.0]-7-undecene was used. A concentration of the metal components in the precursor material liquid was adapted to be 20 mass % to 25 mass % based on metal oxides.

The precursor material liquid was spin coated (2,000 rpm) on the first electrode at room temperature. After the applied film was dried on a hot plate (250° C. to 400° C.), the substrate was placed in an electric furnace at 700° C. for 15 minutes to preliminary fire the applied film. After repeating the steps of application, drying, and preliminarily firing eight times, the substrate was placed in an electric furnace at 730° C. for 60 minutes to perform heat treatment. Thus, a crystallized piezoelectric film was obtained.

Next, as the second electrode, a platinum electrode having a thickness of 400 nm was formed on the piezoelectric film by DC sputtering. As an adhering layer, a titanium oxide film having a thickness of 30 nm was formed between the second electrode and the piezoelectric film.

As described above, the piezoelectric element according to the first mode of the present invention was obtained.

The obtained piezoelectric element was cut and a section thereof was observed under a microscope. It was confirmed that the silicon substrate, the first electrode, the piezoelectric film, and the second electrode were laminated in this order. Further, a portion of the piezoelectric film sandwiched between the first electrode and the second electrode was substantially planar. The film thickness was measured at a plurality of locations, and the maximum film thickness $T_P$ was 2,200 nm. The average $(T_{E1}+T_{E2})/2$ nm of the maximum film thickness $T_{E1}$ nm and the minimum film thickness $T_{E2}$ nm of the first and second electrodes was 500 nm. Composition analysis of an interface portion between the first electrode and the substrate was conducted using a transmission electron microscope and electron energy loss spectroscopy in combination, and it was confirmed that an adhesion component of a Ti metal component existed. A section of the piezoelectric film portion was observed under a transmission electron microscope, and it was confirmed that, from a contrast in electron diffraction, almost an entire region of the section had an aggregate structure formed of grains each having a columnar structure. A grain size at the surface of the film as an average equivalent circle diameter was 3,100 nm.

X-ray diffraction measurement of the piezoelectric film portion of the piezoelectric element was performed with the temperature being changed in the range of from −30° C. to 50° C. In the entire temperature range of from −30° C. to 50° C., peaks corresponding to the perovskite structure of a non-oriented tetragonal crystal, a non-oriented orthorhombic crystal, or both were observed. A lattice constant of a tetragonal crystal structure converted from the peak was compared with a known lattice constant of bulk ceramics having the same composition, and it was found that the piezoelectric film of the piezoelectric element of the example had internal residual stress in a tensile direction due to restraint by the substrate.

The second electrode of the piezoelectric element was removed by polishing processing, and the composition of the piezoelectric film portion was analyzed by XRF. It was found that a principal component was a metal oxide that was able to be expressed by the chemical formula $Ba(Ti_{0.960}Zr_{0.040})O_3$. Further, it was found that 0.010 moles of Mn element and 0.0020 moles of Bi element were contained for 1 mole of the metal oxide.

The piezoelectric element was placed in an environmental test chamber whose temperature was controlled to be in the range of from −30° C. to 50° C., the first electrode and the second electrode of the piezoelectric element were connected to an impedance analyzer (4194A manufactured by Agilent Technologies) outside the test chamber, and dielectric losses at the respective temperatures were measured. An applied voltage was 0.05 V, and values when the frequency was 1 kHz were measured. As a result, it was found that the dielectric loss of the piezoelectric element of Example 1 was 0.3% at room temperature (25° C.) and 0.45% at the maximum in the range of from −30° C. to 50° C. Further, the Curie temperature $T_c$ of the piezoelectric film included in the piezoelectric element of Example 1 was 128° C., and the phase transition temperature $T_{to}$ from a tetragonal crystal to an orthorhombic crystal was 25° C.

Next, for the purpose of measuring a piezoelectric constant $d_{31}$, the piezoelectric element according to the present invention was cut into a strip shape having a length of 15 mm and a width of 2.5 mm and was used as a cantilever. An end portion of the cantilever in a longitudinal direction was fixed, and an alternating voltage was applied to the piezoelectric element. An amount of displacement of vertically reciprocating an end portion of the piezoelectric element on a side opposite to the fixed end portion was measured with a laser Doppler displacement gauge, which was able to be converted into the piezoelectric constant $d_{31}$ using information such as a shape and a Young's modulus of the cantilever.

The constant $d_{31}$ at room temperature (25° C.) was measured. An absolute value $|d_{31}|$ thereof was 153 pm/V.

EXAMPLE 2

The piezoelectric element according to the first mode of the present invention was manufactured similarly to the case of Example 1, except that the method of manufacturing the piezoelectric film was changed from CSD to RF sputtering.

For the purpose of using as a target for sputtering, a sintered body corresponding to a target composition of the piezoelectric film was manufactured. However, taking into consideration a difference in evaporation rate in the film formed by sputtering, A-site elements such as Ba and Bi were adapted to be in excess in the target sintered body. Materials for the target were prepared as follows.

Powdery agents of barium carbonate, bismuth oxide, titanium oxide, zirconium oxide, iron oxide, and manganese dioxide, all of which were at a purity of 99.5% or more and were commercially available, were mixed. At that time, weighing was performed such that Ba, Ti, Zr, Mn, and Bi were at a ratio in composition $Ba(Ti_{0.960}Zr_{0.040})O_3 + 0.010MnO_2 + 0.0020BiO_{3/2}$. The powdery agents were mixed by dry mixing for 24 hours using a ball mill. A total weight of the powdery mixture was 100 parts by weight, and a PVA binder of 3 parts by weight for the powdery mixture was caused to adhere to a surface of the powdery mixture using a spray dryer to perform granulation. Then, the obtained granulated powder was filled in a mold, and a molding pressure of 200 MPa was applied thereto using a press molding machine to manufacture a disc-like formed body (compact). The obtained formed body (compact) was placed in an electric furnace and kept therein for four hours under conditions in which the maximum temperature was 1,350° C. 24 hours in total were taken for sintering in atmospheric air to obtain the target sintered body.

The target sintered body was used to form, by RF sputtering, the piezoelectric film on the first electrode on the substrate that was the same as the substrate used in Example 1. A film formation time was adjusted such that the maximum film thickness was the same as that in the case of Example 1. An atmosphere in the sputtering apparatus was a mixture of argon and oxygen at a ratio of from 10:1 to 20:1, and a vacuum in the order of 0.5 Pa was maintained. Further, the film was formed under a state in which heating to 650° C. was kept from a rear surface of the substrate (surface opposite to the surface on which the first electrode was formed).

The obtained piezoelectric element had structure in which the silicon substrate, the first electrode, the piezoelectric film, and the second electrode were laminated in this order. The maximum film thickness $T_P$ was 1,900 nm. The average $(T_{E1}+T_{E2})/2$ nm of the maximum film thickness $T_{E1}$ nm and the minimum film thickness $T_{E2}$ nm of the first and second electrodes was 400 nm. An adhesion component of a Ti metal component existed at an interface portion between the first electrode and the substrate. A grain size at the surface of the film as an average equivalent circle diameter was 2,700 nm. The piezoelectric film had therein tensile stress. Almost an entire region of a section of the piezoelectric film had an aggregate structure formed of grains each having a columnar structure. X-ray diffraction measurement was performed, and, in the entire temperature range of from −30° C. to 50° C., only peaks corresponding to the perovskite structure of both a non-oriented orthorhombic crystal and a non-oriented tetragonal crystal were observed. Composition of the piezoelectric film portion was equivalent to that of the piezoelectric element of Example 1.

Dielectric losses at the respective temperatures and the piezoelectric constant $d_{31}$ were substantially the same as those of the piezoelectric element of Example 1.

The Curie temperature of the piezoelectric film included in the piezoelectric element was 135° C. Detailed measurement results are shown in Table 4.

EXAMPLES 3 TO 16

Piezoelectric elements according to the present invention having different compositions were obtained by a manufacturing method similar to those of Example 1 and Example 2. Table 1 shows the composition of the piezoelectric films. Kinds of the substrate, the adhering layer, and the first electrode included in the piezoelectric elements, methods of forming the piezoelectric films, the maximum temperatures in film forming processes, and kinds of the second electrodes are shown in Table 2.

"(100) oriented monocrystal" of Example 13 in Table 2 refers to a MgO monocrystalline substrate that was cut out such that a film forming surface thereof was a (100) plane. Similarly, in Example 15, a MgO monocrystalline substrate in which a film forming surface was a (110) plane was used, and, in Example 16, a MgO monocrystalline substrate in which a film forming surface thereof was a (111) plane was used.

Further, "CSD" in the piezoelectric film forming method in Table 2 means that the piezoelectric film was formed by CSD similarly to the manufacturing method in Example 1. On the other hand, "sputtering" in the piezoelectric film forming method in Table 2 means that the piezoelectric film was formed by RF sputtering similarly to the manufacturing method in Example 2.

Results of measurement performed similarly to Example 1 of the maximum film thicknesses $T_P$ of the piezoelectric films and the averages $(T_{E1}+T_{E2})/2$ of the maximum film thicknesses $T_{E1}$ nm and the minimum film thicknesses $T_{E2}$ nm of the first and second electrodes are shown in Table 3.

An adhesion component of a Ti metal component existed at the interface portion between the first electrode and the substrate. Almost an entire region of a section of the piezoelectric film had an aggregate structure formed of grains each having a columnar structure. In X-ray diffraction measurement, in the entire temperature range of from −30° C. to 50° C., peaks corresponding to the perovskite structure of only a non-oriented tetragonal crystal, both a non-oriented tetragonal crystal and a non-oriented orthorhombic crystal, and only a non-oriented orthorhombic crystal were observed. The piezoelectric film portion had therein tensile stress. Compositions of the piezoelectric film portions were as shown in Table 1.

Grain sizes at the film surfaces of the piezoelectric elements were as shown in Table 3, and were 700 nm at the minimum and 3,800 nm at the maximum.

Results of measurement of the Curie temperatures, dielectric losses at respective temperatures, and the piezoelectric constants $d_{31}$ of the piezoelectric elements of the respective examples were as shown in Table 4. The Curie temperature was 101° C. at the minimum and 178° C. at the maximum. Maximum values of the dielectric losses in the range of from −30° C. to 50° C. were in a range of from 0.0038 to 0.0057.

COMPARATIVE EXAMPLE 1

A piezoelectric element for comparison was manufactured similarly to the case of Example 1 except that composition of the piezoelectric film was a metal oxide that was able to be expressed by the chemical formula $Ba(Ti_{0.9}Zr_{0.1})O_3$ and a Mn oxide added at a ratio of 0.020 moles for 1 mole of the metal oxide with reference to Paragraph [0087] of Japanese Patent Application Laid-Open No. 2011-243722.

A section of the piezoelectric film had an aggregate structure formed of grains each having a columnar structure. X-ray diffraction measurement of the piezoelectric film portion of the piezoelectric element for comparison was performed at 25° C., and only a peak corresponding to the perovskite structure of a non-oriented orthorhombic crystal was observed.

Other physical properties were as shown in Table 3 and Table 4. The dielectric loss of the piezoelectric element for comparison in the range of from −30° C. to 50° C. was 2.1% (at 50° C.) at the maximum and 1.1% (at −30° C.) at the minimum, and exceeded the dielectric losses of the piezoelectric elements of the examples in the entire measurement temperature range.

The maximum constant $d_{31}$ of the piezoelectric element for comparison was obtained by measurement at room temperature (25° C.), and the absolute value $|d_{31}|$ thereof was 95 pm/V. $|d_{31}|$ at any of the temperatures fell below $|d_{31}|$ at the same temperature of the piezoelectric element of Example 1.

COMPARATIVE EXAMPLES 2 TO 9

Piezoelectric elements of comparative examples having different compositions were obtained by manufacturing methods similar to those of Example 1 and Example 2. Compositions of the piezoelectric films are shown in Table 1. Similarly to the cases of the examples, film forming conditions were as shown Table 2, forms and states of the films were as shown in Table 3, and physical properties and piezoelectric properties of the piezoelectric films were as shown in Table 4.

TABLE 1

|  | Principal component Barium zirconate titanate | | First auxiliary component | Second auxiliary component |
|---|---|---|---|---|
|  | Zr x | Ti 1 − x | Mn mol | Bi mol |
| Example 1 | 0.040 | 0.960 | 0.010 | 0.00200 |
| Example 2 | 0.040 | 0.960 | 0.010 | 0.00200 |
| Example 3 | 0.040 | 0.960 | 0.015 | 0.00200 |
| Example 4 | 0.060 | 0.940 | 0.010 | 0.00100 |
| Example 5 | 0.050 | 0.950 | 0.010 | 0.00200 |
| Example 6 | 0.020 | 0.980 | 0.010 | 0.00200 |
| Example 7 | 0.130 | 0.870 | 0.005 | 0.00200 |
| Example 8 | 0.100 | 0.900 | 0.005 | 0.00200 |
| Example 9 | 0.040 | 0.960 | 0.002 | 0.00050 |
| Example 10 | 0.040 | 0.960 | 0.002 | 0.00200 |
| Example 11 | 0.040 | 0.960 | 0.002 | 0.00200 |
| Example 12 | 0.040 | 0.960 | 0.010 | 0.00850 |
| Example 13 | 0.040 | 0.960 | 0.010 | 0.00200 |
| Example 14 | 0.040 | 0.960 | 0.010 | 0.00200 |
| Example 15 | 0.040 | 0.960 | 0.010 | 0.00200 |
| Example 16 | 0.040 | 0.960 | 0.010 | 0.00200 |
| Comparative Example 1 | 0.100 | 0.900 | 0.020 | 0.00000 |
| Comparative Example 2 | 0.140 | 0.860 | 0.005 | 0.00100 |
| Comparative Example 3 | 0.060 | 0.940 | 0.010 | 0.00000 |

TABLE 1-continued

| | Principal component Barium zirconate titanate | | First auxiliary component | Second auxiliary component |
|---|---|---|---|---|
| | Zr x | Ti 1 − x | Mn mol | Bi mol |
| Comparative Example 4 | 0.040 | 0.960 | 0.001 | 0.00200 |
| Comparative Example 5 | 0.040 | 0.960 | 0.000 | 0.00200 |
| Comparative Example 6 | 0.040 | 0.960 | 0.018 | 0.00200 |
| Comparative Example 7 | 0.040 | 0.960 | 0.005 | 0.00040 |
| Comparative Example 8 | 0.040 | 0.960 | 0.005 | 0.00900 |
| Comparative Example 9 | 0.015 | 0.985 | 0.010 | 0.00200 |

TABLE 2

| | Substrate | Adhering layer | First electrode | Piezoelectric film forming method | Maximum temperature in film formation ° C. | Second electrode |
|---|---|---|---|---|---|---|
| Example 1 | Silicon | Ti | Pt | CSD | 730 | Pt |
| Example 2 | Silicon | Ti | Pt | Sputtering | 650 | Pt |
| Example 3 | Silicon | Ti | Pt | CSD | 730 | Pt |
| Example 4 | Silicon | Ti | Pt | CSD | 750 | Pt |
| Example 5 | Silicon | Ti | Pt | CSD | 730 | Au |
| Example 6 | Silicon | Ti | Pt | CSD | 750 | Au |
| Example 7 | Silicon | Ti | Pt | CSD | 730 | Pt |
| Example 8 | Silicon | Ti | Pt | Sputtering | 650 | Pt |
| Example 9 | Silicon | Ti | Pt | CSD | 730 | Pt |
| Example 10 | Silicon | Ti | Pt | CSD | 780 | Pt |
| Example 11 | Silicon | Ti | Pt | Sputtering | 650 | Pt |
| Example 12 | Silicon | Ti | Pt | CSD | 700 | Pt |
| Example 13 | (100) oriented monocrystal | Ti | Pt | Sputtering | 650 | Pt |
| Example 14 | (100) oriented monocrystal | Ti | Pt | CSD | 700 | Pt |
| Example 15 | (110) oriented monocrystal | Ti | Pt | Sputtering | 650 | Pt |
| Example 16 | (111) oriented monocrystal | Ti | Pt | Sputtering | 650 | Pt |
| Comparative Example 1 | Silicon | Ti | Pt | CSD | 730 | Pt |
| Comparative Example 2 | Silicon | Ti | Pt | CSD | 730 | Pt |
| Comparative Example 3 | Silicon | Ti | Pt | CSD | 730 | Pt |
| Comparative Example 4 | Silicon | Ti | Pt | CSD | 730 | Pt |
| Comparative Example 5 | Silicon | Ti | Pt | CSD | 730 | Pt |
| Comparative Example 6 | Silicon | Ti | Pt | CSD | 730 | Pt |
| Comparative Example 7 | Silicon | Ti | Pt | CSD | 730 | Pt |
| Comparative Example 8 | Silicon | Ti | Pt | CSD | 730 | Pt |
| Comparative Example 9 | Silicon | Ti | Pt | CSD | 730 | Pt |

TABLE 3

| | $T_P$ nm | $(T_{E1}+T_{E2})/2$ nm | Crystal structure (from −30° C. to 50° C.) | Grain section | Grain size of film surface nm | Residual stress | Oriented state |
|---|---|---|---|---|---|---|---|
| Example 1 | 2,200 | 500 | Tetragonal crystal/orthorhombic crystal | Columnar | 3,100 | Tensile | Random |
| Example 2 | 1,900 | 400 | Tetragonal crystal/orthorhombic crystal | Columnar | 2,700 | Tensile | Random |
| Example 3 | 2,200 | 500 | Tetragonal crystal/orthorhombic crystal | Columnar | 2,800 | Tensile | Random |
| Example 4 | 2,200 | 500 | Orthorhombic crystal | Columnar | 2,700 | Tensile | Random |
| Example 5 | 2,200 | 500 | Orthorhombic crystal | Columnar | 2,400 | Tensile | Random |
| Example 6 | 2,200 | 500 | Tetragonal crystal | Columnar | 3,800 | Tensile | Random |
| Example 7 | 2,200 | 500 | Orthorhombic crystal | Columnar | 900 | Tensile | Random |
| Example 8 | 1,900 | 400 | Orthorhombic crystal | Columnar | 700 | Tensile | Random |
| Example 9 | 2,200 | 500 | Orthorhombic crystal | Columnar | 2,900 | Tensile | Random |
| Example 10 | 2,200 | 500 | Tetragonal crystal/orthorhombic crystal | Columnar | 2,600 | Tensile | Random |
| Example 11 | 1,900 | 400 | Tetragonal crystal/orthorhombic crystal | Columnar | 2,300 | Tensile | Random |
| Example 12 | 2,200 | 500 | Tetragonal crystal | Columnar | 2,300 | Tensile | Random |
| Example 13 | 1,600 | 400 | Tetragonal crystal/orthorhombic crystal | Columnar | 2,000 | Compressive | (100) Oriented |
| Example 14 | 1,600 | 500 | Tetragonal crystal/orthorhombic crystal | Columnar | 2,700 | Compressive | (100) Oriented |
| Example 15 | 1,500 | 400 | Tetragonal crystal/orthorhombic crystal | Columnar | 1,800 | Compressive | (110) Oriented |
| Example 16 | 1,600 | 400 | Tetragonal crystal/orthorhombic crystal | Columnar | 1,700 | Compressive | (111) Oriented |
| Comparative Example 1 | 2,000 | 300 | Orthorhombic crystal | Columnar | 400 | Tensile | Random |
| Comparative Example 2 | 2,000 | 300 | Orthorhombic crystal | Columnar | 300 | Tensile | Random |
| Comparative Example 3 | 2,000 | 300 | Orthorhombic crystal | Columnar | 3,200 | Tensile | Random |
| Comparative Example 4 | 2,000 | 300 | Tetragonal crystal/orthorhombic crystal | Columnar | 2,900 | Tensile | Random |
| Comparative Example 5 | 2,000 | 300 | Tetragonal crystal/orthorhombic crystal | Columnar | 2,900 | Tensile | Random |
| Comparative Example 6 | 2,000 | 300 | Tetragonal crystal/orthorhombic crystal | Columnar | 1,600 | Tensile | Random |
| Comparative Example 7 | 2,000 | 300 | Tetragonal crystal | Columnar | 1,400 | Tensile | Random |
| Comparative Example 8 | 2,000 | 300 | Tetragonal crystal | Columnar | 1,100 | Tensile | Random |
| Comparative Example 9 | 2,000 | 300 | Tetragonal crystal | Columnar | 3,100 | Tensile | Random |

TABLE 4

| | Phase transition temperature $T_{to}$ (° C.) | Curie temperature $T_c$ (° C.) | Piezoelectric constant $|d_{31}|$ (25° C.) (pm/V) | Dielectric loss (25° C.) |
|---|---|---|---|---|
| Example 1 | 25 | 128 | 153 | 0.0045 |
| Example 2 | 22 | 135 | 148 | 0.0043 |
| Example 3 | 27 | 121 | 147 | 0.0038 |
| Example 4 | 55 | 112 | 128 | 0.0053 |
| Example 5 | 33 | 123 | 133 | 0.0048 |
| Example 6 | 9 | 134 | 126 | 0.0041 |
| Example 7 | 72 | 101 | 89 | 0.0055 |
| Example 8 | 53 | 106 | 121 | 0.0057 |
| Example 9 | 51 | 127 | 117 | 0.0057 |
| Example 10 | 26 | 126 | 158 | 0.0053 |
| Example 11 | 23 | 131 | 154 | 0.0055 |
| Example 12 | −6 | 133 | 101 | 0.0047 |
| Example 13 | 21 | 178 | 163 | 0.0046 |
| Example 14 | 23 | 167 | 166 | 0.0048 |
| Example 15 | 24 | 170 | 155 | 0.0045 |
| Example 16 | 23 | 158 | 156 | 0.0044 |
| Comparative Example 1 | 51 | 98 | 95 | 0.0210 |
| Comparative Example 2 | 74 | 91 | 71 | 0.0055 |
| Comparative Example 3 | 61 | 104 | 81 | 0.0071 |
| Comparative Example 4 | 25 | 116 | 126 | 0.0133 |
| Comparative Example 5 | 25 | 116 | 103 | 0.0230 |
| Comparative Example 6 | 27 | 115 | 118 | 0.0224 |
| Comparative Example 7 | 4 | 114 | 78 | 0.0096 |
| Comparative Example 8 | −15 | 116 | 55 | 0.0221 |
| Comparative Example 9 | 11 | 128 | 81 | 0.0033 |

EXAMPLE 17

The piezoelectric element according to the second mode of the present invention having the configuration illustrated in FIG. 15A was manufactured.

Specifically, the piezoelectric element was manufactured in a way similar to that of Example 1 except that the first electrode was not formed and the second electrode was in the shape of combs. The comb electrode pitches were 25 μm, electrode line widths were 10 μm, and a space therebetween was 15 μm.

Further, as illustrated in FIG. 15B, an external power supply was connected to the comb electrodes opposed to each other to form the surface acoustic wave generator according to the present invention. Excitation of a surface acoustic wave depending on an input alternating voltage was confirmed.

(Influence of Manufacturing Method)

As shown in Table 2 with regard to Example 1 and Example 2, it was found that equivalent properties were able to be obtained whether the piezoelectric element according to the present invention was manufactured by CSD or sputtering. With regard to other examples, it was confirmed that effects of the present invention were able to be obtained irrespective of the film forming method.

(Influence of Mn Amount)

Influence of change in Mn amount in the piezoelectric element of Example 1 was examined.

When the Mn content was more than 0.002 moles for mole of the metal oxide as the principal component, piezoelectric properties similar to those of Example 1 were able to be obtained when the Mn content was up to 0.015 moles. However, when the Mn amount was 0.020 moles as in Comparative Example 1, the dielectric loss at room temperature (25° C.) was 0.0210 (2.1%), which was 1.5% or more.

On the other hand, when the Mn content was smaller than 0.005 moles, for example, as in Examples 9, 10, and 11, piezoelectric properties similar to those of Example 1 were able to be obtained when the Mn content was down to 0.002 moles. However, when no Mn was added as in Comparative Example 5, the piezoelectric constant $d_{31}$ at room temperature (25° C.) was steeply reduced (by 30% or more), and the dielectric loss abruptly and significantly increased (to five times or more) compared with Example 1.

(Influence of Bi Amount)

Influence of change in Bi amount in the piezoelectric element of Example 1 was examined.

When the Bi content was more than 0.0005 moles for 1 mole of the metal oxide as the principal component, as in, for example, Examples 9 and 10 in which the Mn content was smaller than those in other examples, the piezoelectric constant $d_{31}$ at room temperature (25° C.) increased. When the Bi content was 0.0010 moles, the piezoelectric constant $d_{31}$ was larger by about 20% than that in Example 9 in which the Bi content was 0.0005 moles. However, when the Bi content was 0.00900 moles as in Comparative Example 8, the dielectric loss at room temperature (25° C.) was 0.0221, which was 0.020 or more.

On the other hand, when no Bi was contained, as in Comparative Example 3, the piezoelectric constant $d_{31}$ at room temperature (25° C.) was about 50% of that in Example 1.

(Influence of Zr Amount)

Influence of change in Zr amount in the piezoelectric element of Example 1 was examined.

When x representing the mole ratio of Zr was 0.050, as in Example 5, the piezoelectric constant $d_{31}$ for increasing the phase transition temperature $T_{to}$ to be higher than room temperature (25° C.) became slightly smaller. Further, as in Example 8 in which the mole ratio of Zr is higher, when x=0.10, the piezoelectric constant at room temperature (25° C.) became smaller than that of the piezoelectric element of Example 1 by 20%. On the other hand, when x=0.14 as in Comparative Example 2, under the influence of increase in phase transition temperature $T_{to}$ and decrease in Curie temperature $T_c$, the piezoelectric constant $d_{31}$ at room temperature (25° C.) was reduced by about 50%.

On the other hand, when x representing the mole ratio of Zr was smaller than 0.050, if x=0.020 as in Example 6, the piezoelectric constants at the respective temperatures were reduced by less than 20%, but, if x=0.015 as in Comparative Example 9, the piezoelectric constant $d_{31}$ was reduced by about 50%.

(Piezoelectric Actuator)

The piezoelectric element of Example was used to manufacture the piezoelectric actuator having the structure illustrated in FIG. 3A and FIG. 3B. Displacement of a thin piece portion of the piezoelectric actuator depending on application of an alternating voltage was confirmed. Note that, as the diaphragm, a $SiO_2$ film having a thickness of 5 μm was used.

The amount of displacement of the thin piece portion of the piezoelectric actuator using the piezoelectric element of Example was more than twice as much as that using the piezoelectric element of Comparative Example.

(Liquid Ejection Head)

A liquid ejection head having the structure illustrated in FIG. 4A was manufactured using the piezoelectric element of Example.

Liquid droplet ejection performance of the obtained liquid ejection head when the applied voltage was 20 V at 10 kHz was evaluated. The ejection performance of the liquid ejection head of Example was satisfactory.

(Liquid Ejection Apparatus)

The liquid ejection head described above was used to manufacture the liquid ejection apparatus illustrated in FIG. 4B. Ink ejection in response to an input electrical signal was confirmed.

(Shake Correction Mechanism)

The piezoelectric actuator described above was used to manufacture the shake correction mechanism illustrated in FIG. 5. As the transfer target, a glass lens and a CMOS element were used. Rotational movement of the transfer target in response to an input electrical signal was confirmed.

(Variable Shape Optical Element)

The piezoelectric actuator described above was used to manufacture the variable shape optical element illustrated in FIG. 6A. As the optical member, a polyacrylic acid-based plastic lens was used. Deformation of the optical member in response to an input electrical signal was confirmed.

(Movable Optical Member)

The piezoelectric actuator described above was used to manufacture the movable optical member illustrated in FIG. 6B. As the piezoelectric strain transfer unit, a metal rod made of aluminum was used, and, as the optical member, a mirror formed by evaporating aluminum on a glass plate was used. Movement or rotation of the optical member in response to an input electrical signal was confirmed.

(Optical Device)

The shake correction mechanism described above was used to manufacture the optical device illustrated in FIG.

7A. It was confirmed that change in optical path of exiting light due to a shake from the outside was able to be suppressed by the function of the shake correction mechanism.

The variable shape optical element described above or the movable optical member of Example was used to manufacture the optical devices illustrated in FIG. 7B and FIG. 7C. Change in optical path in response to application of an alternating voltage was confirmed.

(Image Pickup Apparatus)

The shake correction mechanism described above was used to manufacture the image pickup apparatus illustrated in FIG. 8. It was confirmed that change in a taken image due to a shake from the outside was able to be suppressed by the function of the shake correction mechanism.

(Optical Switch)

The variable shape optical element in which the piezoelectric actuator described above and an optical fiber are dynamically connected was used to manufacture the optical switch illustrated in FIG. 9A. Switching operation of the optical switch in response to an input electrical signal was confirmed.

The piezoelectric actuator described above and the members illustrated in FIG. 9B were dynamically connected to manufacture the optical switch. Switching operation of the optical switch in response to an input electrical signal was confirmed.

(Micromirror Device)

The piezoelectric actuator described above was used to manufacture the micromirror device illustrated in FIG. 10. As the piezoelectric strain transfer unit, a metal rod made of aluminum was used. Movement and rotation of the micromirror device in response to an input electrical signal was confirmed.

(Ultrasonic Wave Probe)

The piezoelectric actuator described above was used to manufacture the ultrasonic wave probe illustrated in FIG. 11A. Operation of sending an ultrasonic wave in response to an input electrical signal and operation of receiving an ultrasonic wave reflected by a subject were confirmed.

(Ultrasonograph)

The ultrasonic wave probe described above was used to manufacture the ultrasonograph illustrated in FIG. 11B. Generation of an ultrasonic wave image with reduced noise from oscillation data of an output/input ultrasonic wave was confirmed.

(Sound Component)

The piezoelectric actuator described above was used to manufacture the sound component illustrated in FIG. 12. Sending of a sound wave in response to an input electrical signal or receiving of a sound wave from the outside was confirmed.

(Angular Velocity Sensor)

The piezoelectric element of Example was used to manufacture the angular velocity sensor having the signal processing unit illustrated in FIG. 13. It was confirmed that change in shape due to movement, rotation, or the like of the sensor body was converted into angular velocity information by the processing unit.

(Vibration Power Generator)

The piezoelectric element of Example was used to manufacture the vibration power generator illustrated in FIG. 14. The vibration power generator was placed on a mechanical pump, and the mechanical pump was actuated. It was confirmed that power generating operation in which vibrational energy was converted into electric energy was performed.

(Piezoelectric Shutter)

The surface acoustic wave generator of Example 3 was used to manufacture the piezoelectric shutter illustrated in FIG. 15C. The piezoelectric film and the comb electrodes were formed on both surfaces of the substrate. Opening/closing operation of the piezoelectric shutter in response to an input electrical signal was confirmed.

The piezoelectric element according to the present invention has a stably high piezoelectric constant and a small dielectric loss at room temperature (25° C.). Further, the piezoelectric element does not contain lead, and thus, loads on the environment are light. Therefore, the piezoelectric element according to the present invention is applicable to a piezoelectric actuator, a liquid ejection head, a liquid ejection apparatus, a shake correction mechanism, a variable shape optical element, a movable optical member, an optical device, an image pickup apparatus, an optical switch, a micromirror device, an ultrasonic wave probe, an ultrasonograph, a sound component, an angular velocity sensor, a vibration power generator, a surface acoustic wave generator, a piezoelectric shutter, and other piezoelectric devices as a whole that use the piezoelectric function.

According to the present invention, a thin film piezoelectric element containing no lead therein, which has a high Curie temperature at a piezoelectric film portion thereof, a small dielectric loss, and a high piezoelectric constant at room temperature can be provided.

Further, the present invention can provide a piezoelectric actuator, a liquid ejection head, a liquid ejection apparatus, a shake correction mechanism, a variable shape optical element, a movable optical member, an optical device, an image pickup apparatus, an optical switch, a micromirror device, an ultrasonic wave probe, an ultrasonograph, a sound component, an angular velocity sensor, a vibration power generator, a surface acoustic wave generator, and a piezoelectric shutter that use the piezoelectric element.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent configurations and functions.

This application claims the benefit of Japanese Patent Application No. 2015-231465, filed Nov. 27, 2015, which is hereby incorporated by reference herein in its entirety.

What is claimed is:

1. A piezoelectric element, comprising:
a substrate;
a first electrode;
a piezoelectric film; and
a second electrode,
wherein the piezoelectric film comprises a perovskite metal oxide comprising barium zirconate titanate, manganese, and trivalent bismuth,
wherein the trivalent bismuth comprises trivalent bismuth positioned at an A site of the perovskite metal oxide,
wherein the piezoelectric film satisfies $0.02 \leq x \leq 0.13$,
where x is a mole ratio of zirconium to a sum of zirconium and titanium,
wherein a manganese content is 0.002 moles to 0.015 moles for 1 mole of barium zirconate titanate, and
wherein a bismuth content is 0.00042 moles to 0.00850 moles for 1 mole of barium zirconate titanate, and
wherein a maximum film thickness $T_P$ nm of the piezoelectric film at a portion sandwiched between the first electrode and the second electrode is 10 μm or less.

2. The piezoelectric element according to claim 1, wherein the piezoelectric film comprises a principal component comprising the perovskite metal oxide expressed by general formula (1):

$$Ba(Ti_{1-x}Zr_x)O_3 \qquad (1),$$

provided that 0.02≤x≤0.13.

3. The piezoelectric element according to claim 1, wherein an average $(T_{E1}+T_{E2})/2$ of a maximum film thickness $T_{E1}$ nm and a minimum film thickness $T_{E2}$ nm of the first electrode and the second electrode is in a range of $0.002 \times T_P \leq (T_{E1}+T_{E2})/2 \leq 500$ nm.

4. The piezoelectric element according to claim 1, further comprising an adhesion component comprising a metal of Group 4 elements and/or Group 5 elements, and existing between the substrate and one of the first electrode and the second electrode that is formed on a surface of the piezoelectric film on a substrate side.

5. The piezoelectric element according to claim 1, wherein the piezoelectric film has an aggregate structure comprising a grain having a columnar structure.

6. The piezoelectric element according to claim 1, wherein the piezoelectric film has residual stress therein in a direction in parallel with a surface of the substrate.

7. The piezoelectric element according to claim 1, wherein a Curie temperature of the piezoelectric film is 121° C. or higher.

8. The piezoelectric element according to claim 1, wherein a crystal forming a perovskite structure of the piezoelectric film is selectively oriented in a direction perpendicular to a surface of the substrate.

9. A piezoelectric actuator, comprising:
the piezoelectric element of claim 1; and
a vibration unit in which the piezoelectric element is formed.

10. A shake correction mechanism, comprising two or more piezoelectric actuators, each being the piezoelectric actuator of claim 9,
wherein the two or more piezoelectric actuators are arranged such that, when a voltage is applied thereto, the two or more piezoelectric actuators expand and contract in two or more directions.

11. An optical device, comprising:
the shake correction mechanism of claim 10; and
an optical member held by the shake correction mechanism.

12. An image pickup apparatus, comprising:
the shake correction mechanism of claim 10; and
an image pickup element unit held by the shake correction mechanism.

13. A variable shape optical element, comprising:
the piezoelectric actuator of claim 9;
an optical member dynamically connected to the piezoelectric actuator; and
a mechanism for changing a shape of the optical member through deformation of the piezoelectric actuator.

14. An optical device, comprising the variable shape optical element of claim 13.

15. An optical switch, comprising the variable shape optical element of claim 13.

16. A movable optical member, comprising:
the piezoelectric actuator of claim 9;
an optical member dynamically connected to the piezoelectric actuator; and
a mechanism for moving and/or rotating the optical member through deformation of the piezoelectric actuator.

17. An optical device, comprising the movable optical member of claim 16.

18. An optical switch, comprising the movable optical member of claim 16.

19. A micromirror device, comprising:
a plurality of micromirrors; and
a plurality of piezoelectric actuators dynamically connected to the plurality of micromirrors, respectively,
wherein each of the plurality of piezoelectric actuators is the piezoelectric actuator of claim 9.

20. An ultrasonic wave probe, comprising the piezoelectric actuator of claim 9 and configured to oscillate an ultrasonic wave and to receive a reflected wave.

21. An ultrasonograph, comprising:
the ultrasonic wave probe of claim 20;
a signal processing unit; and
an image generating unit.

22. A sound component, comprising the piezoelectric actuator of claim 9 and configured to perform one of sending and receiving sound through driving of the piezoelectric actuator.

23. A liquid ejection head, comprising:
a liquid chamber comprising a vibration unit comprising the piezoelectric element of claim 1; and
an ejection orifice communicating with the liquid chamber.

24. A liquid ejection apparatus, comprising:
a placing unit for a transfer target; and
the liquid ejection head of claim 23.

25. An angular velocity sensor, comprising the piezoelectric element of claim 1 and configured to convert change in shape of the piezoelectric element into angular velocity information.

26. A vibration power generator, comprising the piezoelectric element of claim 1 and configured to convert vibrational energy into electric energy.

27. The piezoelectric element according to claim 1, wherein $T_P$ nm is 500 nm to 5,000 nm.

28. The piezoelectric element according to claim 1, wherein $T_P$ nm is 700 nm to 4,000.

29. The piezoelectric element according to claim 1, wherein $T_P$ nm is 1,000 nm to 3,500 nm.

30. A piezoelectric element, comprising:
a substrate;
a piezoelectric film; and
a plurality of comb electrodes,
wherein the piezoelectric film comprises a perovskite metal oxide comprising barium zirconate titanate, manganese, and trivalent bismuth,
wherein the trivalent bismuth comprises trivalent bismuth positioned at an A site of the perovskite metal oxide,
wherein the piezoelectric film satisfies 0.02≤x≤0.13,
where x is a mole ratio of zirconium to a sum of zirconium and titanium,
wherein a manganese content is 0.002 moles to 0.015 moles for 1 mole of barium zirconate titanate, and
wherein a bismuth content is 0.00042 moles to 0.00850 moles for 1 mole of barium zirconate titanate.

31. The piezoelectric element according to claim 30, wherein the piezoelectric film comprises a principal component comprising the perovskite metal oxide expressed by general formula (1):

$$Ba(Ti_{1-x}Zr_x)O_3 \qquad (1),$$

provided that 0.02≤x≤0.13.

32. A surface acoustic wave generator, comprising the piezoelectric element of claim 30.

33. A piezoelectric shutter, comprising:
the surface acoustic wave generator of claim 32; and
a light-shielding component,
wherein the piezoelectric shutter is configured to move the light-shielding component through driving of the surface acoustic wave generator.

34. An electronic apparatus, comprising:
an electronic component; and
a piezoelectric element,
wherein the piezoelectric element comprises:
   a substrate;
   a first electrode;
   a piezoelectric film; and
   a second electrode,
   wherein the piezoelectric film comprises a perovskite metal oxide comprising barium zirconate titanate, manganese, and trivalent bismuth,
   wherein the trivalent bismuth comprises trivalent bismuth positioned at an A site of the perovskite metal oxide,
   wherein the piezoelectric film satisfies $0.02 \leq x \leq 0.13$,
   where x is a mole ratio of zirconium to a sum of zirconium and titanium,
   wherein a manganese content is 0.002 moles to 0.015 moles for 1 mole of barium zirconate titanate, and
   wherein a bismuth content is 0.00042 moles to 0.00850 moles for 1 mole of barium zirconate titanate.

35. An electronic apparatus, comprising:
an electronic component; and
the piezoelectric element of claim 30.

* * * * *